(12) United States Patent
Fan et al.

(10) Patent No.: US 11,847,967 B2
(45) Date of Patent: Dec. 19, 2023

(54) DISPLAY SUBSTRATE AND PREPARATION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Mengyue Fan, Beijing (CN); Wenbo Chen, Beijing (CN); Zhongliu Yang, Beijing (CN); Bing Zhang, Beijing (CN); Chenyu Chen, Beijing (CN); Shuang Zhao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/788,319

(22) PCT Filed: Sep. 2, 2021

(86) PCT No.: PCT/CN2021/116277
§ 371 (c)(1),
(2) Date: Jun. 23, 2022

(87) PCT Pub. No.: WO2022/083309
PCT Pub. Date: Apr. 28, 2022

(65) Prior Publication Data
US 2023/0023708 A1    Jan. 26, 2023

(30) Foreign Application Priority Data

Oct. 19, 2020 (CN) .......................... 202011118923.9

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G11C 19/287* (2013.01);
(Continued)

(58) Field of Classification Search
USPC .......................................................... 345/690
See application file for complete search history.

(56) References Cited

U.S. PATENT DOCUMENTS

2007/0063959 A1* 3/2007 Iwabuchi ............. G09G 3/3258
345/100
2007/0242176 A1* 10/2007 Chang ................. H01L 27/1214
257/E27.111
(Continued)

FOREIGN PATENT DOCUMENTS

CN       101060124 A    10/2007
CN       101109876 A    1/2008
(Continued)

OTHER PUBLICATIONS

International Search Report for PCT/CN2021/116277 dated Nov. 26, 2021.

*Primary Examiner* — Chineyere D Wills-Burns
(74) *Attorney, Agent, or Firm* — Ling Wu; Stephen Yang; Ling and Yang Intellectual Property

(57) ABSTRACT

A display substrate, including: a display region and a peripheral region located on the periphery of the display region. A scan driver circuit is disposed in the peripheral region. A plurality of sub-pixels, and a plurality of first signal lines that are connected to the scan driver circuit and extend in a first direction, are disposed in the display region. The display (Continued)

region includes: a substrate, and a semiconductor layer, a first conductive layer, a second conductive layer and a third conductive layer that are sequentially disposed on the substrate. The third conductive layer comprises: a plurality of first signal lines, and first electrodes and second electrodes of a plurality of transistors. An insulating layer between the third conductive layer and the first conductive layer is provided with first via holes.

20 Claims, 13 Drawing Sheets

(51) Int. Cl.
 *G11C 19/28* (2006.01)
 *H10K 59/131* (2023.01)
 *H10K 71/00* (2023.01)
 *H10K 59/12* (2023.01)
(52) U.S. Cl.
 CPC ........... *H10K 59/131* (2023.02); *H10K 71/00* (2023.02); *G09G 2300/0819* (2013.01); *G09G 2300/0842* (2013.01); *G09G 2310/0286* (2013.01); *G09G 2310/08* (2013.01); *H10K 59/1201* (2023.02)

(56) References Cited

U.S. PATENT DOCUMENTS

| | | | |
|---|---|---|---|
| 2009/0128018 A1* | 5/2009 | Lee | .................... H01L 27/1251 445/24 |
| 2014/0061652 A1 | 3/2014 | Park et al. | |
| 2015/0129844 A1* | 5/2015 | Kang | .................. H10K 59/1213 257/43 |
| 2016/0005766 A1* | 1/2016 | Choi | .................. H01L 21/76877 438/158 |
| 2016/0189659 A1* | 6/2016 | Park | ..................... G09G 3/3696 345/87 |
| 2018/0061922 A1* | 3/2018 | Kim | ................... H10K 59/1213 |
| 2018/0114796 A1* | 4/2018 | Jiang | .................. H01L 27/1248 |
| 2020/0203456 A1* | 6/2020 | Hyung | ............. H01L 29/78669 |
| 2020/0211477 A1* | 7/2020 | Lai | ....................... G09G 3/3258 |
| 2021/0074944 A1* | 3/2021 | Kim | ................... H01L 27/1251 |
| 2021/0096433 A1* | 4/2021 | Shim | .................... G02F 1/1339 |
| 2021/0210563 A1* | 7/2021 | Huang | ............... H01L 27/1214 |
| 2021/0327909 A1 | 10/2021 | Yan | |
| 2021/0335180 A1 | 10/2021 | Sun | |

FOREIGN PATENT DOCUMENTS

| | | |
|---|---|---|
| CN | 101510529 A | 8/2009 |
| CN | 103715202 A | 4/2014 |
| CN | 105448935 A | 3/2016 |
| CN | 107992229 A | 5/2018 |
| CN | 109148479 A | 1/2019 |
| CN | 110176464 A | 8/2019 |
| CN | 111312136 A | 6/2020 |
| CN | 111627386 A | 9/2020 |

\* cited by examiner

US 11,847,967 B2

DISPLAY SUBSTRATE AND PREPARATION METHOD THEREFOR, AND DISPLAY DEVICE

CROSS-REFERENCE TO RELATED APPLICATIONS

The present application is a U.S. National Phase Entry of International Application No. PCT/CN2021/116277 having an international filing date of Sep. 2, 2021, which claims priority to Chinese Patent Application No. 202011118923.9 filed to the China National Intellectual Property Administration (CNIPA) on Oct. 19, 2020 and entitled "Display Substrate and Preparation Method Therefor, and Display Apparatus". The above-identified applications are hereby incorporated by reference.

TECHNICAL FIELD

The present application relates to, but is not limited to, the field of display technologies, and more particularly, to a display substrate, a manufacturing method thereof and a display device.

BACKGROUND

Organic Light-emitting Device (OLED) display substrates, which are display substrates different from traditional Liquid Crystal Displays (LCDs), have advantages such as active luminescence, good temperature characteristics, low power consumption, fast response, flexibility, ultra-thinness and low cost. Therefore, the OLED display substrates have become one of the important developments and discoveries of new generation display devices and have attracted more and more attention.

SUMMARY

The following is a summary of subject matters described herein in detail. The summary is not intended to limit the protection scope of the claims.

The present disclosure provides a display substrate and a manufacturing method thereof and a display device.

In one aspect, the present disclosure provides a display substrate, which includes a display region and a peripheral region located at a periphery of the display region. A scan driving circuit is provided in the peripheral region, and a plurality of sub-pixels and a plurality of first signal lines are provided in the display region, the plurality of first signal lines are connected to the scan driving circuit and extend along a first direction, At least one of the plurality of sub-pixels includes a light-emitting element and a driving circuit used for driving the light-emitting element to emit light, the driving circuit including a plurality of transistors and a storage capacitor. The display region includes a substrate, and a semiconductor layer, a first conductive layer, a second conductive layer and a third conductive layer which are sequentially disposed on the substrate. The semiconductor layer includes active layers of the plurality of transistors; the first conductive layer includes control electrodes of the plurality of transistors and a first electrode of the storage capacitor; the second conductive layer includes a second electrode of the storage capacitor; the third conductive layer includes the plurality of first signal lines and first electrodes and second electrodes of the plurality of transistors; first via holes are provided in an insulating layer between the third conductive layer and the first conductive layer, and the first signal lines contact the control electrodes of the transistors of the first conductive layer, the control electrodes are exposed through the first via holes.

In another aspect, the present disclosure provides a display device including the display substrate described above.

In another aspect, the present disclosure provides a manufacturing method for a display substrate, which is used for manufacturing the display substrate described above and includes: providing a substrate; and forming, in a display region, a semiconductor layer, a first conductive layer, a second conductive layer and a third conductive layer on the substrate sequentially. The semiconductor layer includes active layers of a plurality of transistors; the first conductive layer includes control electrodes of the plurality of transistors and a first electrode of a storage capacitor; the second conductive layer includes a second electrode of the storage capacitor; the third conductive layer includes a plurality of first signal lines and first electrodes and second electrodes of the plurality of transistors; first via holes are provided in an insulating layer between the third conductive layer and the first conductive layer, and the first signal lines contact the control electrodes of the transistors of the first conductive layer, the control electrodes are exposed through the first via holes.

After the drawings and the detailed description are read and understood, the other aspects may become clear.

BRIEF DESCRIPTION OF DRAWINGS

The drawings depicted herein are intended to provide an understanding for technical schemes of the present disclosure and form a part of the specification, and are intended to explain the technical schemes of the present disclosure together with embodiments of the present disclosure and do not constitute a limitation to the technical schemes of the present disclosure.

DETAILED DESCRIPTION

Figure 1:
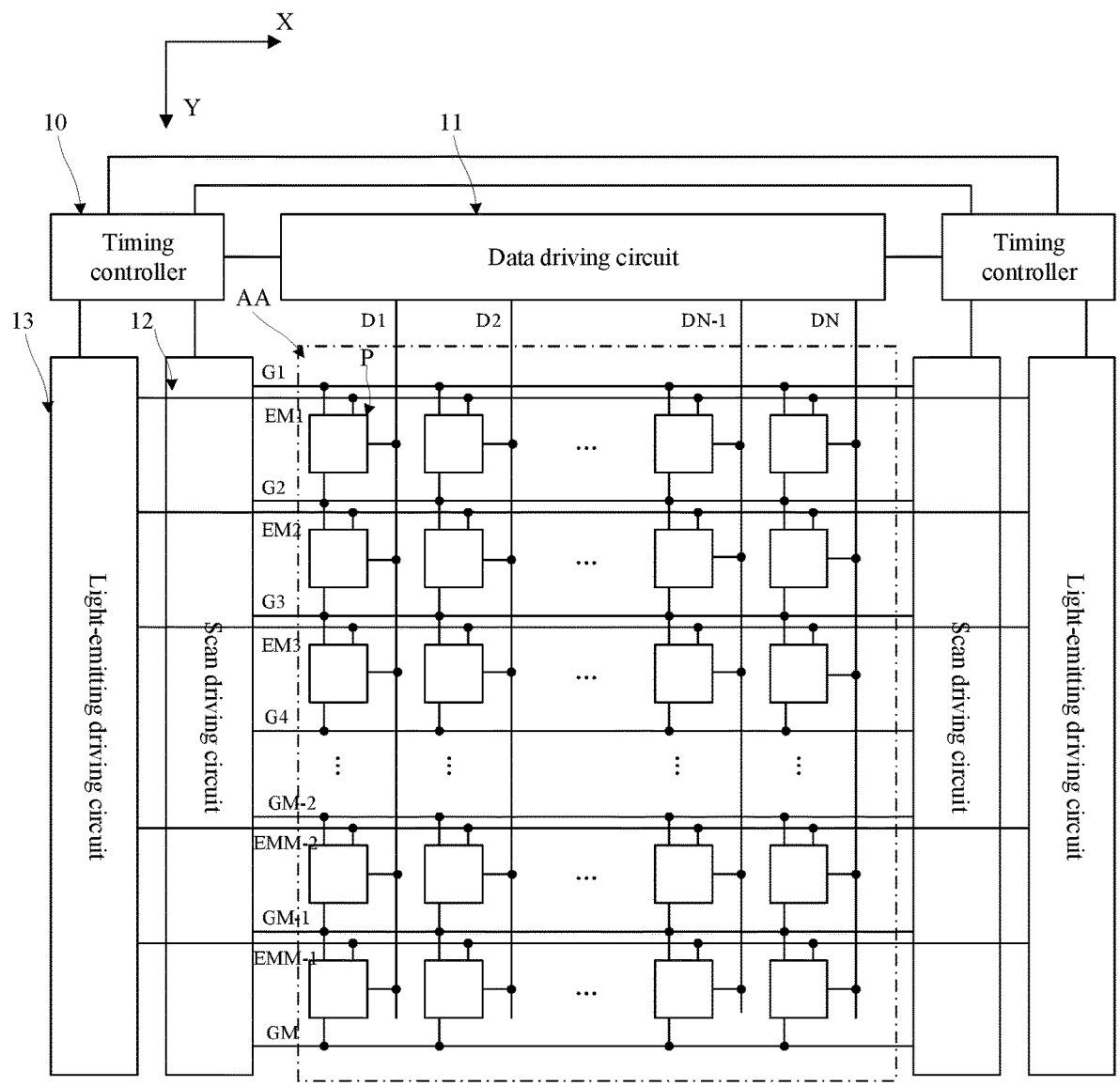
FIG. 1 is a schematic diagram of a structure of a display substrate in accordance with at least one embodiment of the present disclosure.

Multiple embodiments are described in the present disclosure, but the description is exemplary rather than restrictive. Moreover, it is apparent to those of ordinary skills in the art that there may be more embodiments and implementations within the scope contained by the embodiments described in the present disclosure. Although many possible combinations of features are shown in the drawings and discussed in the implementations, many other combinations of the disclosed features are also possible. Unless specifically limited, any feature or element of any embodiment may be used in combination with any other feature or element in any other embodiment, or may substitute any other feature or element in any other embodiment.

Combinations of the features and elements known to those of ordinary skills in the art are included and conceived in the present disclosure. The embodiments, features and elements disclosed in the present disclosure may also be combined with any conventional feature or element to form a unique technical scheme defined by the claims. Any feature or element of any embodiment may also be combined with features or elements from other technical schemes to form another unique technical scheme defined by the claims. Therefore, it should be understood that any feature shown or discussed in the present disclosure may be implemented independently or in any appropriate combination. Therefore, the embodiments are not subject to other restrictions except the restriction made according to the appended claims and equivalents thereof. In addition, one or more modifications and alterations may be made within the protection scope of the appended claims.

In addition, when a representative embodiment is described, a method or a process may have been already presented as a specific sequence of steps in the specification. However, the method or the process should not be limited to the steps in the specific order to the extent that the method or the process does not depend on the specific order of steps described herein. Those of ordinary skills in the art will understand that other orders of steps may also be possible. Therefore, the specific order of steps set forth in the specification should not be interpreted as a limitation to the claims. In addition, the claims with respect to the method or the process should not be limited to executing their steps in the written order. Those skilled in the art may easily understand that these orders may change, and still remain within the spirit and scope of the embodiments of the present disclosure.

The implementations will be described below with reference to the drawings. The implementations may be implemented in a number of different forms. Those of ordinary skills in the art may readily understand the fact that implementations and contents thereof may be transformed into different forms without departing from the purpose and scope of the present disclosure. Therefore, the present disclosure should not be interpreted as being limited to the contents recorded in following implementations only.

Sometimes for the sake of clarity, the size of each constituent element, the thickness of a layer or a region in the drawings may be exaggerated. Therefore, one implementation of the present disclosure is not necessarily limited to the size, and the shape and size of each component in the drawings do not reflect the true proportion. In addition, the drawings schematically illustrate ideal examples, and one implementation of the present disclosure is not limited to the shapes or numerical values shown in the drawings.

Ordinal numerals such as "first", "second", "third" and the like in the specification are set to avoid confusion of the constituent elements, but not to set a limit in quantity. In the present disclosure, "a plurality of" may refer to two or more than two.

For convenience, the terms such as "middle", "upper", "lower", "front", "back", "vertical", "horizontal", "top", "bottom", "inside", "outside" and the like indicating orientation or position relationships are used in the present disclosure to illustrate position relationships between the constituent elements with reference to the drawings, and are intended to facilitate description of the specification and simplify the description, but not to indicate or imply that the mentioned device or element must have a specific orientation or be constructed and operated in a specific orientation, therefore, they should not be understood as limitations to the present disclosure. It may be understood that when an element such as a layer, film, region or substrate is described as being "on" or "under" another element, it can be "directly" located "on" or "under" the other element, or there may be an intermediate element therebetween. The position relationships between the constituent elements are appropriately changed according to a direction of each constituent element described. Therefore, words and phrases used in the specification are not limited and appropriate substitutions may be made according to situations.

In the present disclosure, the terms such as "connected", "coupled", "linked" or the like are not limited to a physical or mechanical connection, but may include an electrical connection, whether direct or indirect. "Electrical connection" includes a case where constituent elements are connected together through an element with certain electrical effects. The "element with certain electrical effects" is not particularly limited as long as electrical signals can be sent and received between the connected constituent elements. Examples of the "element with certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is greater than −10° and less than 10°, or may include a state in which the angle is greater than −5° and less than 5°. In addition, "vertical" refers to a state in which an angle formed by two straight lines is greater than 80° and less than 100°, or may include a state in which the angle is greater than 85° and less than 95°.

In the present disclosure, "film" and "layer" may be interchangeable. For example, sometimes "conductive layer" may be replaced by "conductive film". Similarly, sometimes "insulating film" may be replaced by "insulating layer".

In the present disclosure, a transistor refers to a component which at least includes three terminals, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region and the source electrode. In the present disclosure, the channel region refers to a region which the current flows mainly through. In the present disclosure, the channel region refers to a region through which the current mainly flows. In the case that transistors with opposite polarities are used or the case that a current direction is changed during circuit operation, functions of the "source electrode" and the "drain electrode" are sometimes interchanged. Therefore, the "source electrode" and the "drain electrode" can be interchanged in the present disclosure.

It may be understood by those of skills in the art that transistors used in all the embodiments of the present disclosure may be thin film transistors, or field-effect transistors, or other devices with same characteristics. Exemplarily, the thin film transistors used in the embodiments of the present disclosure may be oxide semiconductor transistors. Because a source electrode and a drain electrode of a switching transistor used herein are symmetrical, the source electrode and the drain electrode are interchangeable. In the embodiments of the present disclosure, a control electrode may be a gate electrode. In order to distinguish between two electrodes of the transistor except the gate electrode, one of the two electrodes is referred to as a first electrode and the other is referred to as a second electrode. The first electrode may be a source electrode or a drain electrode, and the second electrode may be a drain electrode or a source electrode.

With the wide application and development of display technology, the market demand for medium and large size OLED display substrates gradually emerges. With the increase in resolution of the OLED display substrate, a scanning duration of each row of sub-pixels in the OLED display substrate is getting shorter and shorter, and a writing duration of a data signal keeps decreasing. With the increase in size of the OLED display substrate, the length of a gate line arranged transversely in the OLED display substrate gradually increases, thereby resulting easily in serious gate drive delay and causing insufficient charging of the sub-pixels. Moreover, with the increase in refresh rate, the trend of insufficient charging is getting more obvious.

Embodiments of the present disclosure provide a display substrate, a manufacturing method thereof and a display device, so as to improve the resolution and refresh rate of the display substrate.

At least one embodiment of the present disclosure provides a display substrate, which includes a display region and a peripheral region located at a periphery of the display region. A scan driving circuit is provided in the peripheral region. A plurality of sub-pixels and a plurality of first signal lines are provided in the display region, the plurality of first signal lines are connected to the scan driving circuit and extend along a first direction. At least one of the plurality of sub-pixels includes a light-emitting element and a driving circuit used for driving the light-emitting element to emit light, the driving circuit including a plurality of transistors and a storage capacitor. The display region includes a substrate, and a semiconductor layer, a first conductive layer, a second conductive layer and a third conductive layer which are sequentially disposed on the substrate. The semiconductor layer includes active layers of the plurality of transistors. The first conductive layer includes control electrodes of the plurality of transistors and a first electrode of the storage capacitor. The second conductive layer includes a second electrode of the storage capacitor. The third conductive layer includes the plurality of first signal lines and first electrodes and second electrodes of the plurality of transistors. First via holes are provided in an insulating layer between the third conductive layer and the first conductive layer, and the first signal lines contact the control electrodes of the transistors of the first conductive layer, the control electrodes are exposed through the first via holes.

In the display substrate in accordance with the embodiment, the first signal lines used to connect the control electrodes of the transistors and the scan driving circuit are arranged on the same layer as the first electrodes and the second electrodes of the transistors, and the connection between the first signal lines and the control electrodes of the transistors is implemented through the first via holes provided in the insulating layer between the third conductive layer and the first conductive layer, such that the impedances of the first signal lines can be greatly reduced, thereby reducing gate drive delay of the driving circuit of the sub-pixel, and the effective charging duration can be improved, thereby further improving the resolution and refresh rate of the display substrate.

In some exemplary implementations, the display region further includes a fourth conductive layer disposed at one side of the third conductive layer away from the substrate. The fourth conductive layer includes a plurality of second signal lines extending along a second direction perpendicular to the first direction. Second via holes are provided in an insulating layer between the fourth conductive layer and the third conductive layer, and the second signal lines contact the first electrodes or the second electrodes of the transistors of the third conductive layer, the first electrodes or the second electrodes are exposed through the second via holes. In the present exemplary implementation, direct intersection of the second signal lines and the first signal lines can be avoided by arranging the second signal lines perpendicular to the extension direction of the first signal lines on the fourth conductive layer.

In some exemplary implementations, the third conductive layer may include a three-layer stacked structure formed from titanium (Ti), aluminum (Al) and titanium. That is, the third conductive layer may include a titanium layer, an aluminum layer and a titanium layer stacked in sequence. However, this embodiment is not limited thereto. In some examples, the third conductive layer may be a single-layer metal structure. In the present exemplary embodiment, the third conductive layer is formed from a metal material with low electrical resistivity, so as to decrease the resistances of the first signal lines.

In some exemplary implementations, an orthographic projection of the first signal line on the substrate may at least partially overlap with an orthographic projection of a control electrode of a transistor connected to the first signal line on the substrate. In some examples, the orthographic projection of the first signal line on the substrate may cover the orthographic projection of the control electrode of the transistor connected to the first signal line on the substrate. However, this embodiment is not limited thereto.

In some exemplary implementations, a plurality of first via holes may be provided along the extension direction of the first signal lines, and the orthographic projection of the first signal line on the substrate may cover an orthographic projection of the first via hole on the substrate.

In some exemplary implementations, the first signal lines may include scan lines. The scan driving circuit may include a plurality of cascaded shift register units. The ith stage shift register unit may provide scan signals to the ith row of sub-pixels through the scan lines, wherein i is an integer greater than 0.

In some exemplary implementations, the first signal lines may include scan lines and reset signal lines. The scan driving circuit may include a plurality of cascaded shift register units. The ith stage shift register unit may provide scan signals to the ith row of sub-pixels through the scan lines, and the ith stage shift register unit may provide reset signals to the (i+1)th row of sub-pixels through the reset signal lines, wherein i is an integer greater than 0.

In some exemplary implementations, the shift register unit may include a first transistor to an eighth transistor, a first capacitor and a second capacitor. A control electrode of the first transistor is connected to a first clock signal terminal, a first electrode of the first transistor is connected to a first voltage terminal, and a second electrode of the first transistor is connected to a first control node. A control electrode of the second transistor is connected to a second control node, a first electrode of the second transistor is connected to the first clock signal terminal, and a second electrode of the second transistor is connected to the first control node. A control electrode of the third transistor is connected to the first clock signal terminal, a first electrode of the third transistor is connected to a signal input terminal, and a second electrode of the third transistor is connected to the second control node. A control electrode of the fourth transistor is connected to the first control node, a first electrode of the fourth transistor is connected to a second voltage terminal, and a second electrode of the fourth transistor is connected to a first electrode of the fifth transistor. A control electrode of the fifth transistor is connected to a second clock signal terminal, and a second electrode of the fifth transistor is connected to the second control node. A control electrode of the sixth transistor is connected to the first voltage terminal, a first electrode of the sixth transistor is connected to the second control node, and a second electrode of the sixth transistor is connected to a third control node. A control electrode of the seventh transistor is connected to the third control node, a first electrode of the seventh transistor is connected to an output terminal, and a second electrode of the seventh transistor is connected to the second clock signal terminal. A control electrode of the eighth transistor is connected to the first control node, a first electrode of the eighth transistor is connected to the second voltage terminal, and a second electrode of the eighth transistor is connected to the output terminal. A first electrode of the first capacitor is connected to the output terminal, and a second electrode of the first capacitor is connected to the third control node. A first electrode of the second capacitor is connected to the second voltage terminal, and a second electrode of the second capacitor is connected to the first control node. However, this embodiment is not limited thereto.

In some exemplary implementations, a light-emitting driving circuit may be provided in the peripheral region. A plurality of light-emitting control lines connected to the light-emitting driving circuit and extending along the first direction may be provided in the display region, and the light-emitting driving circuit may provide light-emitting control signals to the sub-pixels through the light-emitting control lines. The first conductive layer may further include a plurality of light-emitting control lines. The light-emitting control lines and the control electrode of at least one transistor in the driving circuits of a row of sub-pixels may be an integrated structure. However, this embodiment is not limited thereto.

In some exemplary implementations, the second signal lines may include data lines, first power lines and initial signal lines. In some examples, each column of sub-pixels may be connected to the same data line and the same first power line. In some examples, each row of sub-pixels may be connected to the same initial signal line. However, this embodiment is not limited thereto.

In some exemplary implementations, the display region may further include a first insulating layer, a second insulating layer, a third insulating layer and a fourth insulating layer. The first insulating layer may be disposed between the semiconductor layer and the first conductive layer, the second insulating layer may be disposed between the first conductive layer and the second conductive layer, the third insulating layer may be disposed between the second conductive layer and the third conductive layer, and the fourth insulating layer may be disposed between the third conductive layer and the fourth conductive layer.

In some exemplary implementations, for at least one sub-pixel, the plurality of transistors of the driving circuit may include a first switching transistor to a sixth switching transistor and a driving transistor. A control electrode of the first switching transistor is connected to the scan line, a first electrode of the first switching transistor is connected to the data line, and a second electrode of the first switching transistor is connected to a first electrode of the driving transistor. A control electrode of the second switching transistor is connected to the scan line, a first electrode of the second switching transistor is connected to a control electrode of the driving transistor, and a second electrode of the second switching transistor is connected to a second electrode of the driving transistor. A control electrode of the third switching transistor is connected to the light-emitting control line, a first electrode of the third switching transistor is connected to the first power line, and a second electrode of the third switching transistor is connected to the first electrode of the driving transistor. A control electrode of the fourth switching transistor is connected to the light-emitting control line, a first electrode of the fourth switching transistor is connected to the second electrode of the driving transistor, and a second electrode of the fourth switching transistor is connected to a first electrode of the light-emitting element. A control electrode of the fifth switching transistor is connected to the reset signal line, a first electrode of the fifth switching transistor is connected to the initial signal line, and a second electrode of the fifth switching transistor is connected to the first electrode of the second switching transistor. A control electrode of the sixth switching transistor is connected to the reset signal line, a first electrode of the sixth switching transistor is connected to the initial signal line, and a second electrode of the sixth switching transistor is connected to the first electrode of the light-emitting element. A first electrode of the storage capacitor is connected to the control electrode of the driving transistor, and a second electrode of the storage capacitor is connected to the first power line. In the present exemplary embodiment, the driving circuit of the sub-pixel may be a 7T1C structure (including 7 transistors and 1 capacitor). However, this embodiment is not limited thereto. In some examples, the driving circuit of the sub-pixel may be a 2T1C or 3T1C structure.

In some exemplary implementations, the reset signal line, to which the control electrode of the fifth switching transistor is connected, and the reset signal line, to which the control electrode of the sixth switching transistor is connected, may be located respectively at both sides of the scan line, to which the control electrodes of the first switching transistor and the second switching transistor are connected. In some examples, a distance between the reset signal line, to which the control electrode of the sixth switching transistor is connected, and the scan line may be greater than a distance between the reset signal line, to which the control electrode of the fifth switching transistor is connected, and the scan line. However, this embodiment is not limited thereto.

In some exemplary implementations, second electrodes of storage capacitors located in adjacent sub-pixels of the same row may be in direct contact. In some examples, the second electrodes of the storage capacitors located in the adjacent sub-pixels of the same row may be an integral structure. However, this embodiment is not limited thereto.

In some exemplary implementations, the first electrode of the storage capacitor and the control electrode of the driving transistor may be an integral structure. The second electrode of the storage capacitor may have a hollowed area, an orthographic projection of the control electrode of the driving transistor on the substrate may cover an orthographic projection of the hollowed area on the substrate, and the first electrode of the second switching transistor may be connected to the control electrode of the driving transistor through the hollowed area.

In some exemplary implementations, the display region may further include a fifth conductive layer, a fifth insulating layer disposed between the fourth conductive layer and the fifth conductive layer, and an organic light-emitting layer and a second electrode of the light-emitting element disposed at one side of the fifth conductive layer away from the substrate. The fifth conductive layer may include the first electrode of the light-emitting element. The second electrode of the light-emitting element may be disposed at one side of the organic light-emitting layer away from the substrate. In some examples, the first electrode of the light-emitting element may be an anode of the light-emitting element and the second electrode of the light-emitting element may be a cathode of the light-emitting element.

The display substrate in accordance with the embodiment of the present disclosure will be described through some examples.

FIG. 1 is a schematic diagram of a structure of a display substrate in accordance with at least one embodiment of the present disclosure. As shown in FIG. 1, the display substrate in accordance with the present exemplary embodiment includes a display region AA and a peripheral region located at a periphery of the display region AA. A plurality of sub-pixels P arranged regularly, a plurality of first signal lines (including scan lines and reset signal lines) and a plurality of light-emitting control lines extending along a first direction (e.g., the X direction in FIG. 1), and a plurality of second signal lines (including data lines, first power lines and initial signal lines) extending along a second direction (e.g., the Y direction in FIG. 1) may be provided in the display region AA. The first direction and the second direction may be in the same plane, and the first direction may be perpendicular to the second direction. In this example, each of the first signal lines may extend along the X direction and the plurality of first signal lines may be sequentially arranged along the Y direction; each of the second signal lines may extend along the Y direction, and the plurality of second signal lines may be sequentially arranged along the X direction.

As shown in FIG. 1, M rows of scan lines G1 to GM are arranged along the Y direction, and N columns of data lines D1 to DN are arranged along the X direction and are insulated from the scan lines. Both M and N are positive integers greater than 0. The sub-pixels P may be distributed at intersecting positions of the M rows of scan lines and the N columns of data lines. The plurality of sub-pixels P are arranged orderly according to a matrix-like rule. In some examples, three sub-pixels emitting light of different colors (e.g., red, green and blue) or four sub-pixels emitting light of different colors (e.g., red, green, blue and white) may constitute a pixel unit. However, this embodiment is not limited thereto.

In order to facilitate distinguishing between the scan lines and the rows of sub-pixels, the rows of sub-pixels are sometimes called as row 1, row 2 . . . , and row M in order from the top in FIG. 1. Likewise, in order to facilitate distinguishing between the data lines and the columns of sub-pixels, the columns of sub-pixels are sometimes called as column 1, column 2 . . . , and column N in order from the left in FIG. 1.

In the present exemplary embodiment, a timing controller 10, a data driving circuit 11, a scan driving circuit 12 and a light-emitting driving circuit 13 may be provided in the peripheral region. The scan driving circuit 12 and the light-emitting driving circuit 13 may be arranged at two opposite sides (e.g., left and right sides) of the display region AA respectively. The timing controller 10 and the data driving circuit 11 may be arranged at one side of the display region AA. However, this embodiment is not limited thereto.

In the present exemplary embodiment, the data driving circuit 11 may provide data signals to the sub-pixels through the data lines. The scan driving circuit 12 may provide scan signals to the sub-pixels through the scan lines and provide reset signals to the sub-pixels through the reset signal lines. The light-emitting driving circuit 13 may provide light-emitting control signals to the sub-pixels through the light-emitting control lines. The timing controller 10 may provide drive signals to the data driving circuit 11, the scan driving circuit 12 and the light-emitting driving circuit 13. Actions of the scan driving circuit 12, the data driving circuit 11 and the light-emitting driving circuit 13 may be controlled by the timing controller 10. The timing controller 10 may provide gray scale data specifying gray scales that should be displayed at the sub-pixels to the data driving circuit 11. The data driving circuit 11 may provide, via the data lines, data signals of potentials corresponding to the gray scale data of the sub-pixels to the sub-pixels in rows selected by the scan driving circuit 12

Figure 2:
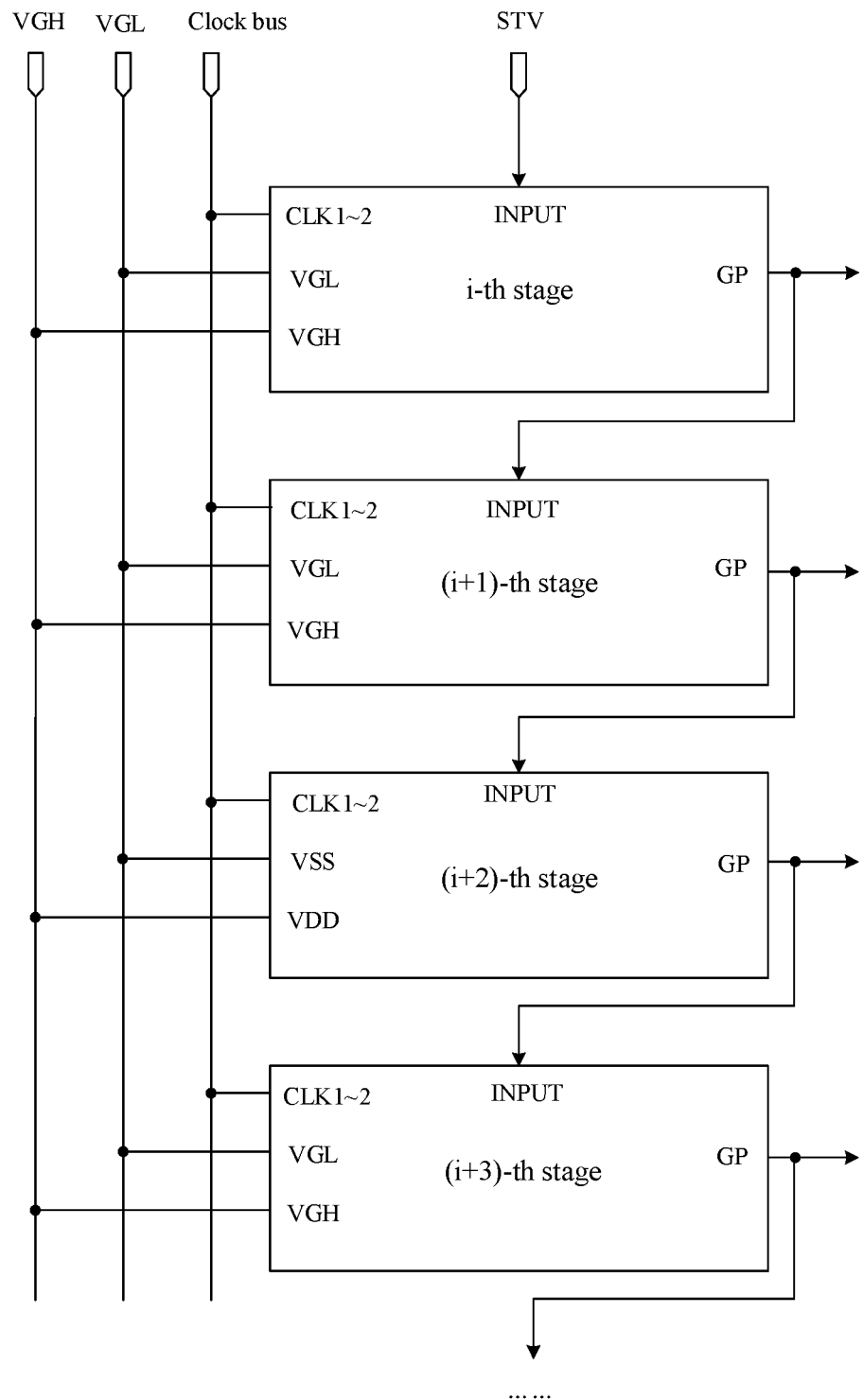
FIG. 2 is a schematic diagram of a structure of a scan driving circuit in accordance with at least one embodiment of the present disclosure.

FIG. 2 is a schematic diagram of a structure of a scan driving circuit in accordance with at least one embodiment of the present disclosure. As shown in FIG. 2, the scan driving circuit in accordance with the present exemplary embodiment may include a plurality of cascaded shift register units. A signal input terminal INPUT (1) of the first stage shift register unit is connected to an initial signal terminal STV, and an output terminal GP (i) of the ith stage shift register unit is connected to a signal input terminal INPUT (i+1) of the $(i+1)^{th}$ stage shift register unit. The output terminal GP (i) of the ith stage shift register unit can provide scan signals to the ith row of sub-pixels through scan lines and provide reset signals to the (i+1)$^{th}$ row of sub-pixels through reset signal lines. Herein, i is an integer greater than 0.

Figure 3:
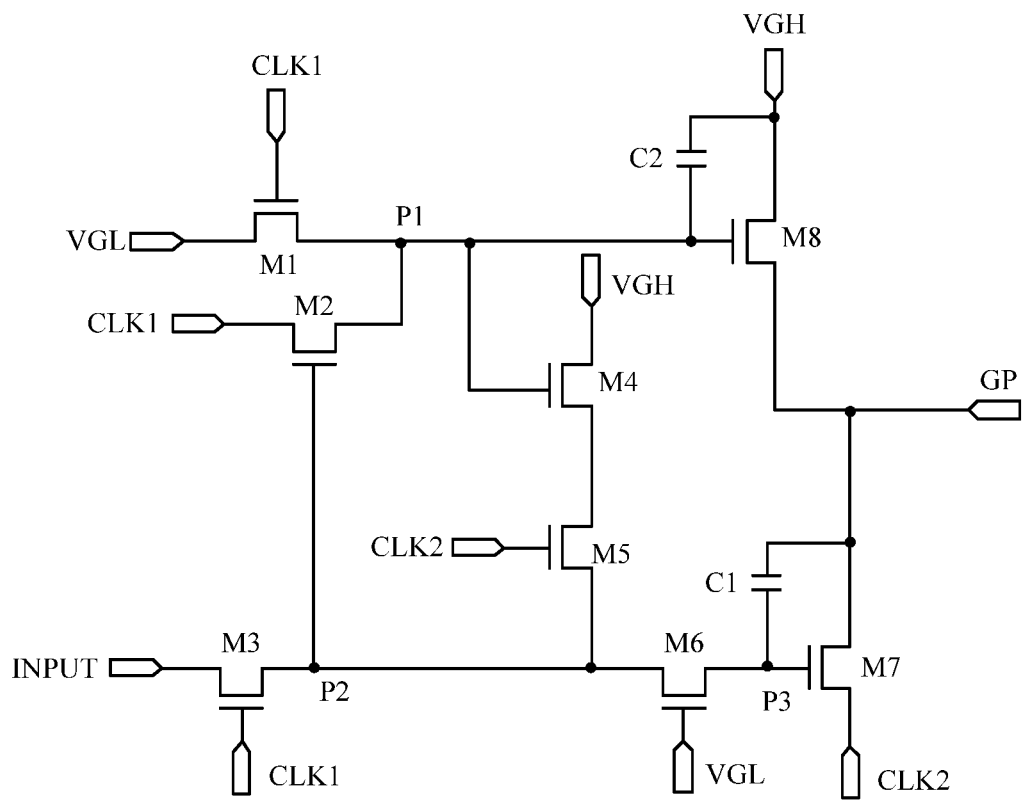
FIG. 3 is an equivalent circuit diagram of a shift register unit in accordance with at least one embodiment of the present disclosure.

FIG. 3 is an equivalent circuit diagram of a shift register unit at any stage of a scan driving circuit in accordance with at least one embodiment of the present disclosure. As shown in FIG. 3, the shift register unit in accordance with the present exemplary embodiment may include a first transistor M1 to an eighth transistor M8, a first capacitor C1 and a second capacitor C2.

In the present exemplary embodiment, a control electrode of the first transistor M1 is connected to a first clock signal terminal CLK1, a first electrode of the first transistor M1 is connected to a voltage terminal VGL, and a second electrode of the first transistor M1 is connected to a first control node P1. A control electrode of the second transistor M2 is connected to a second control node P2, a first electrode of the second transistor M2 is connected to the first clock signal terminal CLK1, and a second electrode of the second transistor M2 is connected to the first control node P1. A control electrode of the third transistor M3 is connected to the first clock signal terminal CLK1, a first electrode of the third transistor M3 is connected to an input terminal INPUT, and a second electrode of the third transistor M3 is connected to the second control node P2. A control electrode of the fourth transistor M4 is connected to the first control node P1, a first electrode of the fourth transistor M4 is connected to a second voltage terminal VGH, and a second electrode of the fourth transistor M4 is connected to a first electrode of the fifth transistor M5. A control electrode of the fifth transistor M5 is connected to a second clock signal terminal CLK2, and a second electrode of the fifth transistor M5 is connected to the second control node P2. A control electrode of the sixth transistor M6 is connected to the first voltage terminal VGL, a first electrode of the sixth transistor M6 is connected to the second control node P2, and a second electrode of the sixth transistor M6 is connected to a third control node P3. A control electrode of the seventh transistor M7 is connected to the third control node P3, a first electrode of the seventh transistor M7 is connected to the second clock signal terminal CLK2, and a second electrode of the seventh transistor M7 is connected to an output terminal GP. A control electrode of the eighth transistor M8 is connected to the first control node P1, a first electrode of the eighth transistor M8 is connected to the second voltage terminal VGH, and a second electrode of the eighth transistor M8 is connected to the output terminal GP. A first electrode of the first capacitor C1 is connected to the output terminal GP, and a second electrode of the first capacitor C1 is connected to the third control node P3. A first electrode of the second capacitor C2 is connected to the second voltage terminal VGH, and a second electrode of the second capacitor C2 is connected to the first control node P1.

Figure 4:
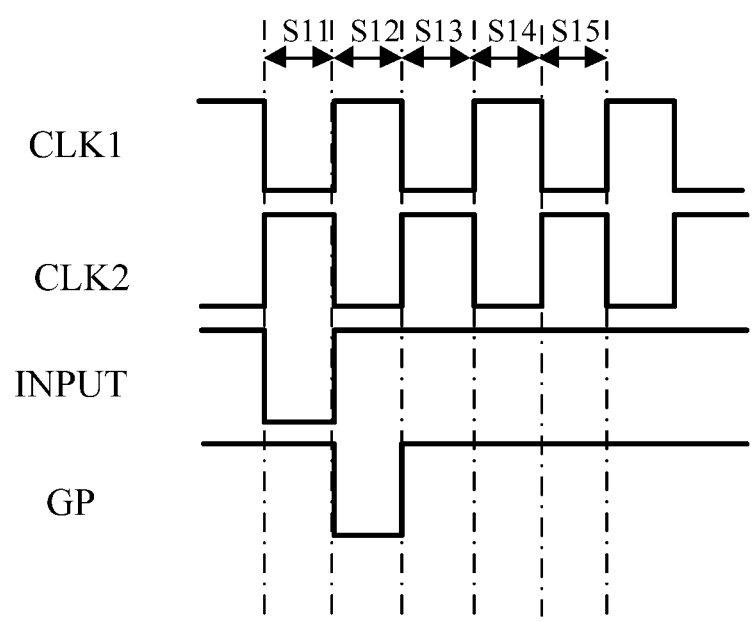
FIG. 4 is a working time sequence diagram of the shift register unit provided in FIG. 3.

A working process of the shift register unit shown in FIG. 3 will be described exemplarily below by taking the transistors M1 to M8 being P-type thin film transistors as an example. The working process of a first stage shift register unit is illustrated below by way of example. FIG. 4 is a working time sequence diagram of the shift register unit provided in FIG. 3. As shown in FIGS. 3 and 4, the shift register unit in accordance with the present exemplary embodiment may include 8 transistor units (M1 to M8), 2 capacitor units (C1 and C2), 3 input terminals (INPUT, CLK1 and CLK2), 1 output terminal (GP) and 2 voltage terminals (VGL and VGH). The first voltage terminal VGL may provide low-level signals continuously, and the second voltage terminal VGH may provide high-level signals continuously.

In an input stage S11, an input signal of the first clock signal terminal CLK1 is at the low level, and the first transistor M1 and the third transistor M3 are turned on. In the case that the first transistor M1 is turned on and an input signal of the first voltage terminal VGL is at the low level, an potential of the first control node P1 is pulled down; in the case that the third transistor M3 is turned on and an input signal of the signal input terminal INPUT is at the low level, an potential of the second control node P2 is pulled down, so that the second transistor M2 is turned on, further ensuring that the potential of the first control node P1 is pulled down. Because the potential of the first control node P1 is pulled down, the fourth transistor M4 and the eighth transistor M8 are turned on. In the case that the eighth transistor M8 is turned on and an input signal of the second voltage terminal VGH is at the high level, an potential of the output terminal GP is pulled up. In the case that an input signal of the second clock signal terminal CLK2 is at the high level, the fifth transistor M5 is turned off. In the case that the input signal of the first voltage terminal VGL is at the low level, the sixth transistor M6 is turned on and an potential of the third control node P3 is pulled down by the potential of the second control node P2, so that the seventh transistor M7 is turned on, further ensuring that the potential of the first output terminal GP is pulled up.

In an output stage S12, the input signal of the first clock signal terminal CLK1 is at the high level, the first transistor M1 and the third transistor M3 are turned off, the potential of the second control node P2 is kept at the low level, the second transistor M2 is turned on, and the potential of the first control node P1 is kept at the high level. Moreover, under the action of the second capacitor C2, the first control node P1 can be further ensured to be kept at the high level. Because the potential of the first control node P1 is kept at the high level, the fourth transistor M4 and the eighth transistor M8 are turned off. The input signal of the second clock signal terminal CLK2 is at the low level, and the fifth transistor M5 is turned on. The input signal of the first voltage terminal VGL is at the low level, the sixth transistor M6 is turned on, and the potential of the third control node P3 is further pulled down by the second control node P2, so that the seventh transistor M7 is turned on, and the potential of the output terminal GP is pulled down by the input signal of the second clock signal terminal CLK2.

In a reset stage S13, the input signal of the first clock signal terminal CLK1 is at the low level, the first transistor M1 and the third transistor M3 are turned on, and the potential of the first control node P1 is pulled down by the input signal of the first voltage terminal VGL; the input signal of the signal input terminal INPUT is at the high level, the potential of the second control node P2 is pulled up, so that the second transistor M2 is turned off. Because the potential of the first control node P1 is pulled down, the fourth transistor M4 and the eighth transistor M8 are turned on. In the case that the eighth transistor M8 is turned on and the input signal of the second voltage terminal VGH is at the high level, the potential of the output terminal GP can be kept at the high level. The input signal of the second clock signal terminal CLK2 is at the high level, and the fifth transistor M5 is turned off. The input signal of the first voltage terminal VGL is at the low level, the sixth transistor M6 is turned on, and the potential of the third control node P3 is pulled up by the second control node P2, so that the seventh transistor M7 is turned off.

In a first holding stage S14, the input signal of the first clock signal terminal CLK1 is at the high level, the first switching transistor M1 and the third switching transistor M3 are turned off, the input signal of the signal input terminal INPUT is at the high level, the potential of the second control node P2 is kept at the high level, the second transistor M2 is turned off, and the potential of the first control node P1 is kept at the low level. Because the potential of the first control node P1 is kept at the low level, the fourth transistor M4 and the eighth transistor M8 are turned on, and the potential of the output terminal GP is kept at the high level. The input signal of the second clock signal terminal CLK2 is at the low level, and the fifth transistor M5 is turned on. The potential of the first voltage terminal VGL is at the low level, the sixth transistor M6 is turned on, the potential of the third control node P3 is kept at the high level, and the seventh transistor M7 is turned off.

In a second holding stage S15, the input signal of the first clock signal terminal CLK1 is at the low level, the first transistor M1 and the third transistor M3 are turned on, the input signal of the signal input terminal INPUT is at the high level, the potential of the second control node P2 is kept at the high level, the second transistor M2 is turned off, and the potential of the first control node P1 is kept at the low level. Because the potential of the first control node P1 is kept at the low level, the fourth transistor M4 and the eighth transistor M8 are turned on, and the potential of the output terminal GP is kept at the high level. The input signal of the second clock signal terminal CLK2 is at the high level, and the fifth transistor M5 is turned off. The potential of the first voltage terminal VGL is at the low level, the sixth transistor M6 is turned on, the potential of the third control node P3 is kept at the high level, and the seventh transistor M7 is turned off.

Subsequent to the second holding stage, the first holding stage and the second holding stage can be repeated until the input signal of the signal input terminal INPUT is at the low level, and then the process restarts from the input stage.

In the present exemplary embodiment, at least one of the sub-pixels may include a light-emitting element and a driving circuit used for driving the light-emitting element to emit light. The driving circuit may include a plurality of transistors and a storage capacitor. In this example, the driving circuit of the sub-pixel may be a 7T1C structure (including 7 transistors and 1 capacitor). However, this embodiment is not limited thereto. In some examples, the driving circuit of the sub-pixel may be a 2T1C or 3T1C structure.

Figure 5:
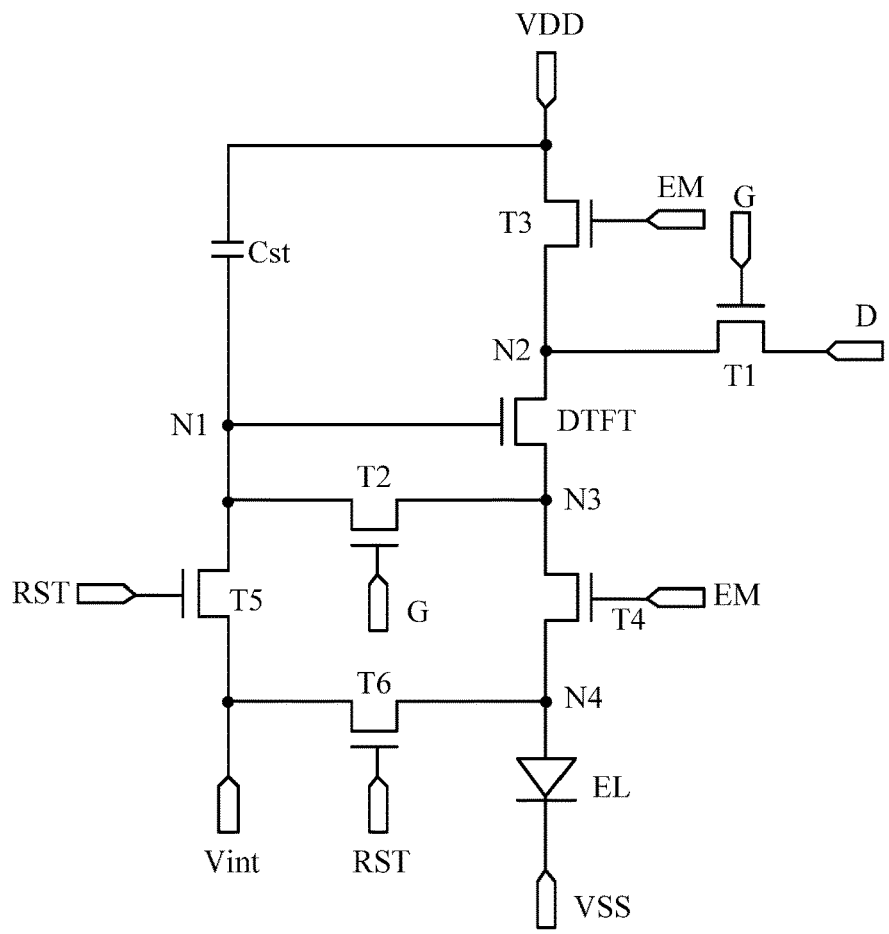
FIG. 5 is an equivalent circuit diagram of a driving circuit of a sub-pixel in accordance with at least one embodiment of the present disclosure.

FIG. 5 is an equivalent circuit diagram of a driving circuit in accordance with at least one embodiment of the present disclosure. As shown in FIG. 5, the driving circuit in accordance with the present exemplary embodiment may include a first switching transistor T1 to a sixth switching transistor T6, a driving transistor DTFT and a storage capacitor Cst.

In the present exemplary embodiment, a control electrode of the driving transistor DTFT is connected to a first node N1, a first electrode of the driving transistor DTFT is connected to a second node N2, and a second electrode of the driving transistor DTFT is connected to a third node N3. A control electrode of the first switching transistor T1 is connected to a scan line G, a first electrode of the first switching transistor T1 is connected to a data line D, and a second electrode of the first switching transistor T1 is connected to the second node N2. A control electrode of the second switching transistor T2 is connected to the scan line G, a first electrode of the second switching transistor T2 is connected to the first node N1, and a second electrode of the second switching transistor T2 is connected to the third node N3. A control electrode of the third switching transistor T3 is connected to a light-emitting control line EM, a first electrode of the third switching transistor T3 is connected to a first power line VDD, and a second electrode of the third switching transistor T3 is connected to the second node N2. A control electrode of the fourth switching transistor T4 is connected to the light-emitting control line EM, a first electrode of the fourth switching transistor T4 is connected to the third node N3, and a second electrode of the fourth switching transistor T4 is connected to an anode of a light-emitting element EL. A control electrode of the fifth switching transistor T5 is connected to a reset signal line RST, a first electrode of the fifth switching transistor T5 is connected to an initial signal line Vint, and a second electrode of the fifth switching transistor T5 is connected to the first node N1. A control electrode of the sixth switching transistor T6 is connected to the reset signal line RST, a first electrode of the sixth switching transistor T6 is connected to the initial signal line Vint, and a second electrode of the sixth switching transistor T6 is connected to the anode of the light-emitting element EL. A first electrode of the storage capacitor Cst is connected to the first node N1, and a second electrode of the storage capacitor Cst is connected to the first power line VDD. A cathode of the light-emitting element EL is connected to a second power line VSS.

Figure 6:
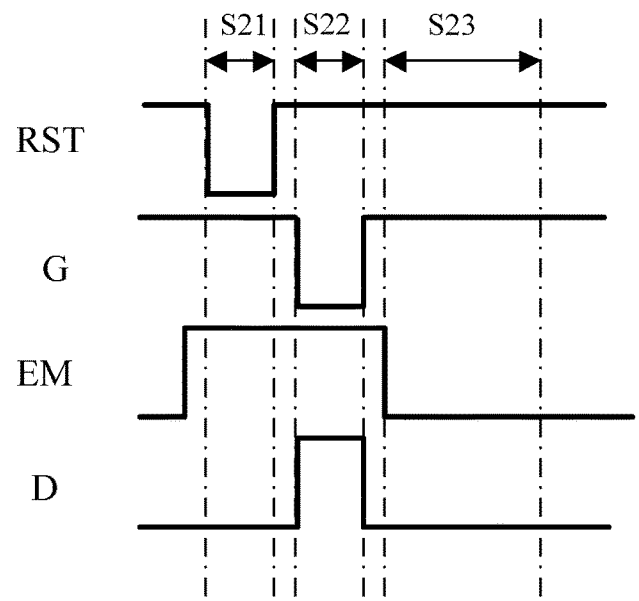
FIG. 6 is a working time sequence diagram of the driving circuit provided in FIG. 5.

A working process of the driving circuit provided in FIG. 5 will be described exemplarily below by taking all the first switching transistor T1 to the sixth switching transistor T6 and the driving transistor DTFT being P-type thin film transistors as an example. FIG. 6 is a working sequence diagram of the driving circuit provided in FIG. 5. As shown in FIG. 5, the driving circuit involved in the present exemplary embodiment may include 6 switching transistors (T1 to T6), 2 1 driving transistor (DTFT), 1 capacitor unit (Cst), 5 signal input terminals (D, G, EM, RST and Vint) and 2 voltage terminals (VDD and VSS). Exemplarily, the first power line VDD may provide high-level signals continuously, and the second power line VSS may provide low-level signals continuously.

In a reset stage S21, a high-level signal is input by the scan line G, and the first switching transistor T1 and the second switching transistor T2 are turned off. A high-level signal is input by the light-emitting control line EM, and the third switching transistor T3 and the fourth switching transistor T4 are turned off. A low-level signal is input by the reset signal line RST, the fifth switching transistor T5 and the sixth switching transistor T6 are turned on, and a signal inputted by the initial signal line Vint is provided to the first node N1 and a fourth node N4 to reset the first node N1 and the fourth node N4, thereby eliminating the influence of the previous frame signals.

In a writing stage S22, a high-level signal is input by the reset signal line RST, and the fifth switching transistor T5 and the sixth switching transistor T6 are turned off. A high-level signal is input by the light-emitting control line EM, and the third switching transistor T3 and the fourth switching transistor T4 are turned off. A low-level signal is input by the scan line G, and the first switching transistor T1 and the second switching transistor T2 are turned on. The first switching transistor M1 is turned on to provide a data signal input by the data line DATA to the second node N2, at this time, an potential Vn2 of the second node N2 meets Vn2=Vdata, and Vdata is a voltage value of the data signal. The second switching transistor M2 is turned on to connect the first node N1 with the third node N3, i.e., connect the control electrode of the driving transistor DTFT with the second electrode of the driving transistor DTFT to write the data signal transmitted to the second node N2 and a threshold voltage Vth (i.e., a compensation signal) of the driving transistor DTFT to the first node N1 while charging the storage capacitor Cst, at this point an potential Vn1 of the first node N1 meets Vn1=Vdata-Vth. The data signal can be written to the control electrode of the driving transistor DTFT and the threshold voltage of the driving transistor DTFT can be compensated in the writing stage S21 to eliminate the influence of the threshold voltage of the driving transistor DTFT on a driving current in a light-emitting stage.

In the light-emitting stage S23, a high-level signal is inputted by the reset signal line RST, and the fifth switching transistor T5 and the sixth switching transistor T6 are turned off. A high-level signals is inputted by the scan line G, and the first switching transistor T1 and the second switching transistor T2 are turned off. A low-level signal is input by the light-emitting control line EM, and the third switching transistor T3 and the fourth switching transistor T4 are turned on. The third switching transistor T3 is turned on to provide a signal input by the first power line VDD to the second node N2, at this point Vn2=Vvdd. The driving transistor DTFT is turned on under the action of the signals (i.e., the data signal and the compensation signal) of the first node N1, and outputs the driving current under the action of the signal provided by the first power line VDD to drive the light-emitting element EL to emit light. If the potential of the first node N1 is kept unchanged at Vdata-Vth under the action of the storage capacitor Cst, a source-gate voltage of the driving transistor DTFT may be:

$$Vsg=Vn2-Vn1=Vvdd-Vdata+Vth.$$

I-V curve equation of the transistors is as below:

$$I=K(Vsg-Vth)^2=K(Vvdd-Vdata)^2,$$

wherein K is a fixed constant related to process parameters and geometric dimensions of the driving transistor DTFT.

It follows that the driving current is independent of the threshold voltage of the driving transistor DTFT, and the influence of the threshold voltage on the light-emitting element EL is eliminated, so that the display uniformity and the light-emitting efficiency can be improved.

Figure 7:
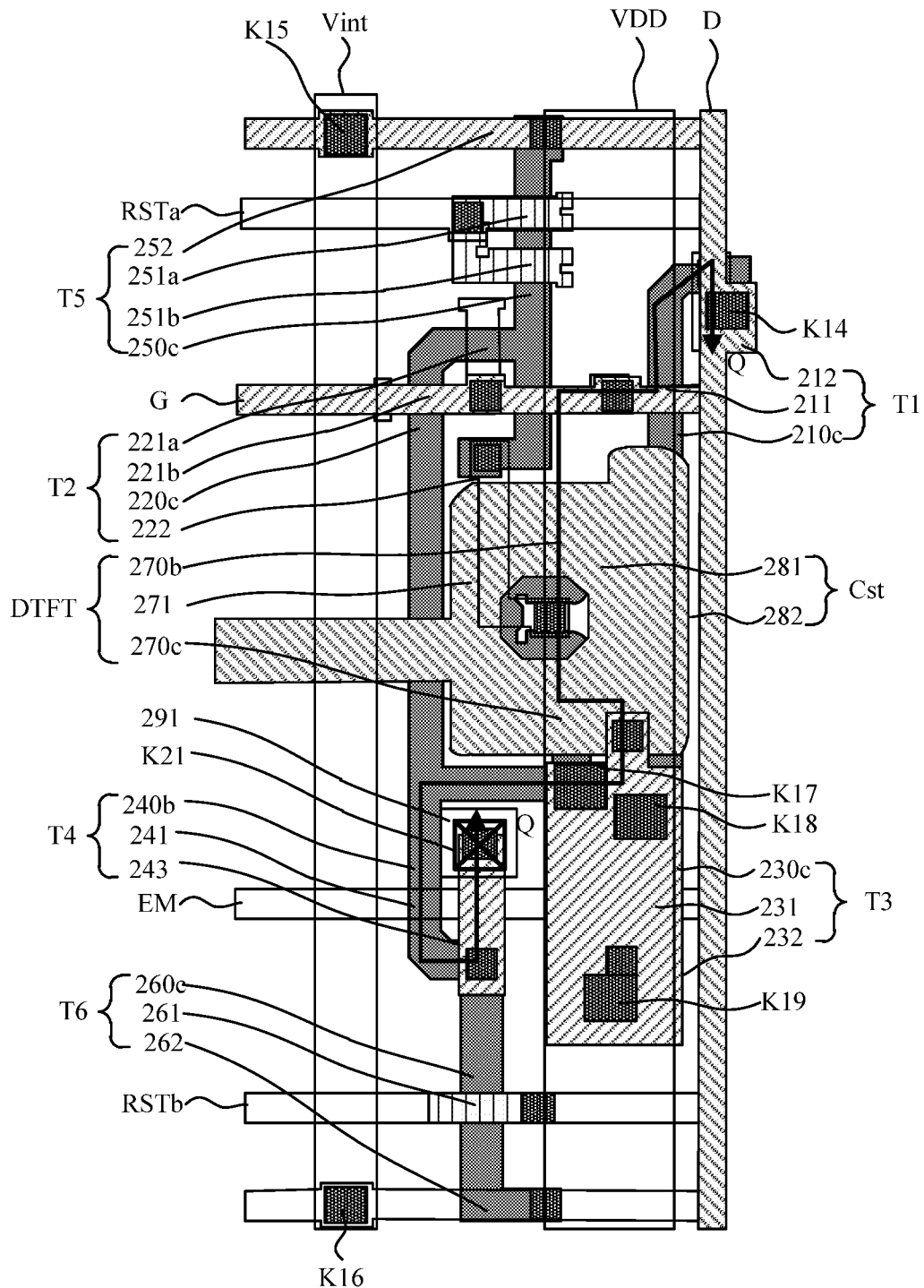
FIG. 7 is a top view of a sub-pixel of a display substrate in accordance with at least one embodiment of the present disclosure.
Figure 8:
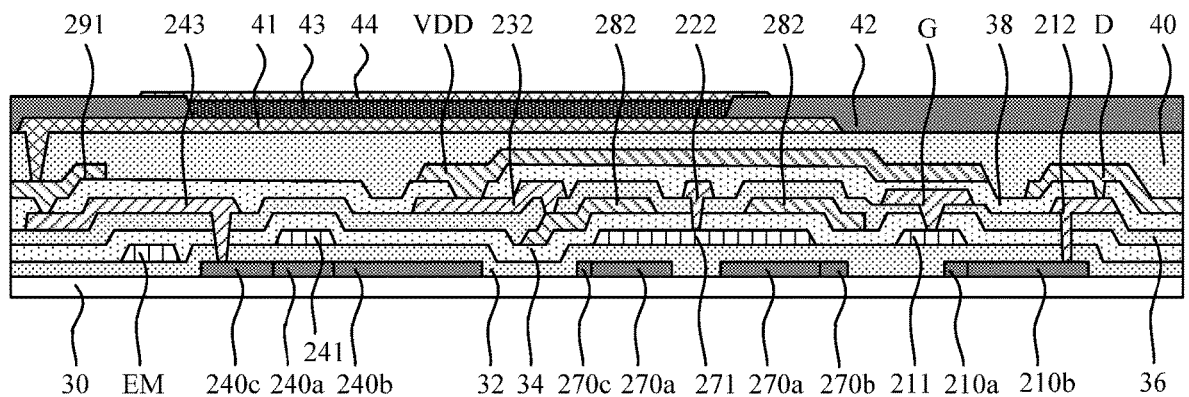
FIG. 8 is a schematic partial sectional view taken along a Q-Q direction in FIG. 7.

FIG. 7 is a top view of a sub-pixel of a display substrate in accordance with at least one embodiment of the present disclosure. FIG. 8 is a schematic partial sectional view taken along a Q-Q direction in FIG. 7. As shown in FIGS. 7 and 8, a display region of the display substrate in accordance with the present exemplary embodiment may include a substrate 30, and a semiconductor layer, a first conductive layer, a second conductive layer, a third conductive layer, a fourth conductive layer and a fifth conductive layer which are sequentially disposed on the substrate 30. A first insulating layer 32 may be disposed between the semiconductor layer and the first conductive layer, a second insulating layer 34 may be disposed between the first conductive layer and the second conductive layer, a third insulating layer 36 may be disposed between the second conductive layer and the third conductive layer, a fourth insulating layer 38 may be disposed between the third conductive layer and the fourth conductive layer, and a fifth insulating layer 40 may be disposed between the fourth conductive layer and the fifth conductive layer. The fifth conductive layer may include an anode 41 of a light-emitting element. An organic light-emitting layer 43 and a cathode 44 of the light-emitting element are also provided on the fifth conductive layer.

Figure 9:
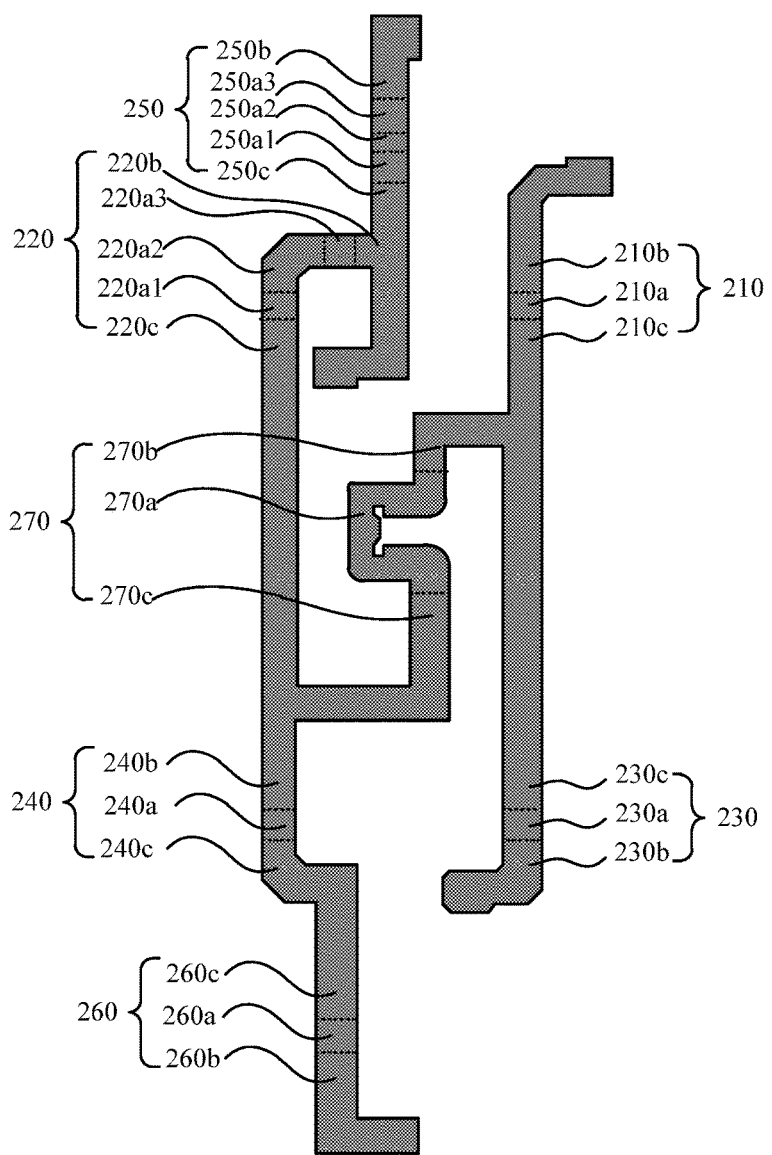
FIG. 9 is a top view of a display substrate after a semiconductor layer is formed in at least one embodiment of the present disclosure.

FIG. 9 is a top view of a display substrate after a semiconductor layer is formed in at least one embodiment of the present disclosure. As shown in FIGS. 7 to 9, a fifth switching transistor T5, a second switching transistor T2, a first switching transistor T1, a driving transistor DTFT, a third switching transistor T3, a fourth switching transistor T4 and a sixth switching transistor T6 may be formed along the semiconductor layer as shown in FIG. 9. As shown in FIG. 9, the semiconductor layer may have a curved or bent shape. The semiconductor layer may include an active layer 210 of the first switching transistor T1, an active layer 220 of the second switching transistor T2, an active layer 230 of the third switching transistor T3, an active layer 240 of the fourth switching transistor T4, an active layer 250 of the fifth switching transistor T5, an active layer 260 of the sixth switching transistor T6 and an active layer 270 of the driving transistor DTFT.

In the present exemplary embodiment, a material of the active layer may include polysilicon or metal oxide. In some examples, the active layer may include a channel region, a first doped region and a second doped region. The channel region may not be doped with impurities, and has characteristics of semiconductors. The first doped region and the second doped region may be at both sides of the channel region and doped with impurities, and thus are conductive. The impurities may be changed according to the type of the transistor.

In the present exemplary embodiment, the first doped region or second doped region of the active layer may be interpreted as a source electrode or drain electrode of the transistor. For example, the source electrode of the driving transistor may correspond to the first doped region at a periphery of the channel region of the active layer and doped with impurities, and the drain electrode of the driving transistor may correspond to the second doped region at the periphery of the channel region of the active layer and doped with impurities. In addition, portions of the active layers between the transistors may be interpreted as wirings doped with impurities, and may be used for electrically connecting the transistors.

Figure 10:
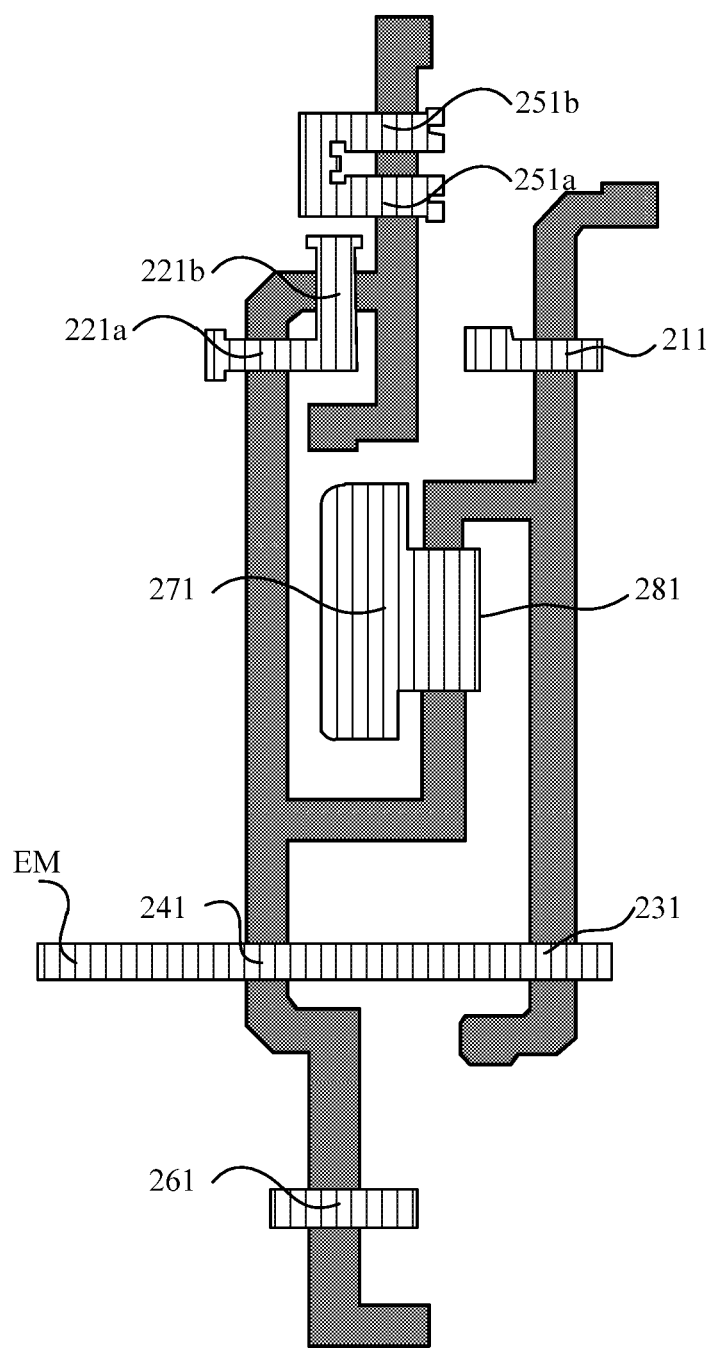
FIG. 10 is a top view of a display substrate after a first conductive layer is formed in at least one embodiment of the present disclosure.

FIG. 10 is a top view of a display substrate after a first conductive layer is formed in at least one embodiment of the present disclosure. As shown in FIGS. 7 to 10, the first conductive layer may include a light-emitting control line EM, a control electrode 211 of the first switching transistor T1, control electrodes 221a and 221b of the second switching transistor T2, a control electrode 231 of the third switching transistor T3, a control electrode 241 of the fourth switching transistor T4, control electrodes 251a and 251b of the fifth switching transistor T5, a control electrode 261 of the sixth switching transistor T6, a control electrode 271 of the driving transistor DTFT and a first electrode 281 of the storage capacitor Cst.

In the present exemplary embodiment, the control electrode 271 of the driving transistor DTFT and the first electrode 281 of the storage capacitor Cst may be an integrated structure. The light-emitting control line EM, the control electrode 231 of the third switching transistor T3 and the control electrode 241 of the fourth switching transistor T4 may be an integrated structure. The control electrodes 221a and 221b of the second switching transistor T2 may be an integrated structure. The control electrodes 251a and 251b of the fifth switching transistor T5 may be an integrated structure.

Figure 11:
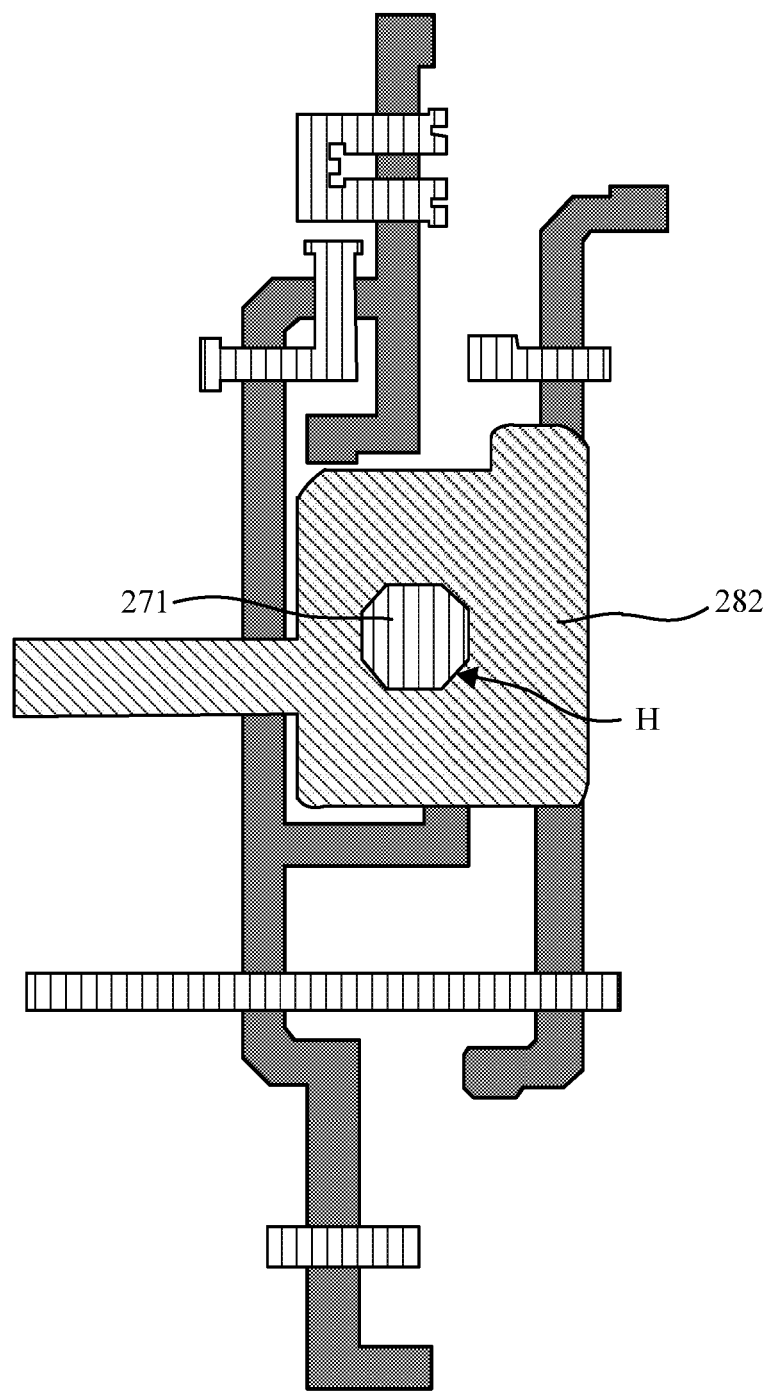
FIG. 11 is a top view of a display substrate after a second conductive layer is formed in at least one embodiment of the present disclosure.

FIG. 11 is a top view of a display substrate after a second conductive layer is formed in at least one embodiment of the present disclosure. As shown in FIGS. 7 to 11, the second conductive layer may include a second electrode 282 of the capacitor Cst. In the present exemplary embodiment, the second electrode 282 of the storage capacitor Cst may have a hollowed area H. An orthographic projection of the control electrode 271 of the driving transistor DTFT on the substrate 30 may cover an orthographic projection of the hollowed area H on the substrate 30. In some examples, the orthographic projection of the hollowed area H on the substrate 30 may be circular or polygonal. However, this embodiment is not limited thereto.

Figure 12:
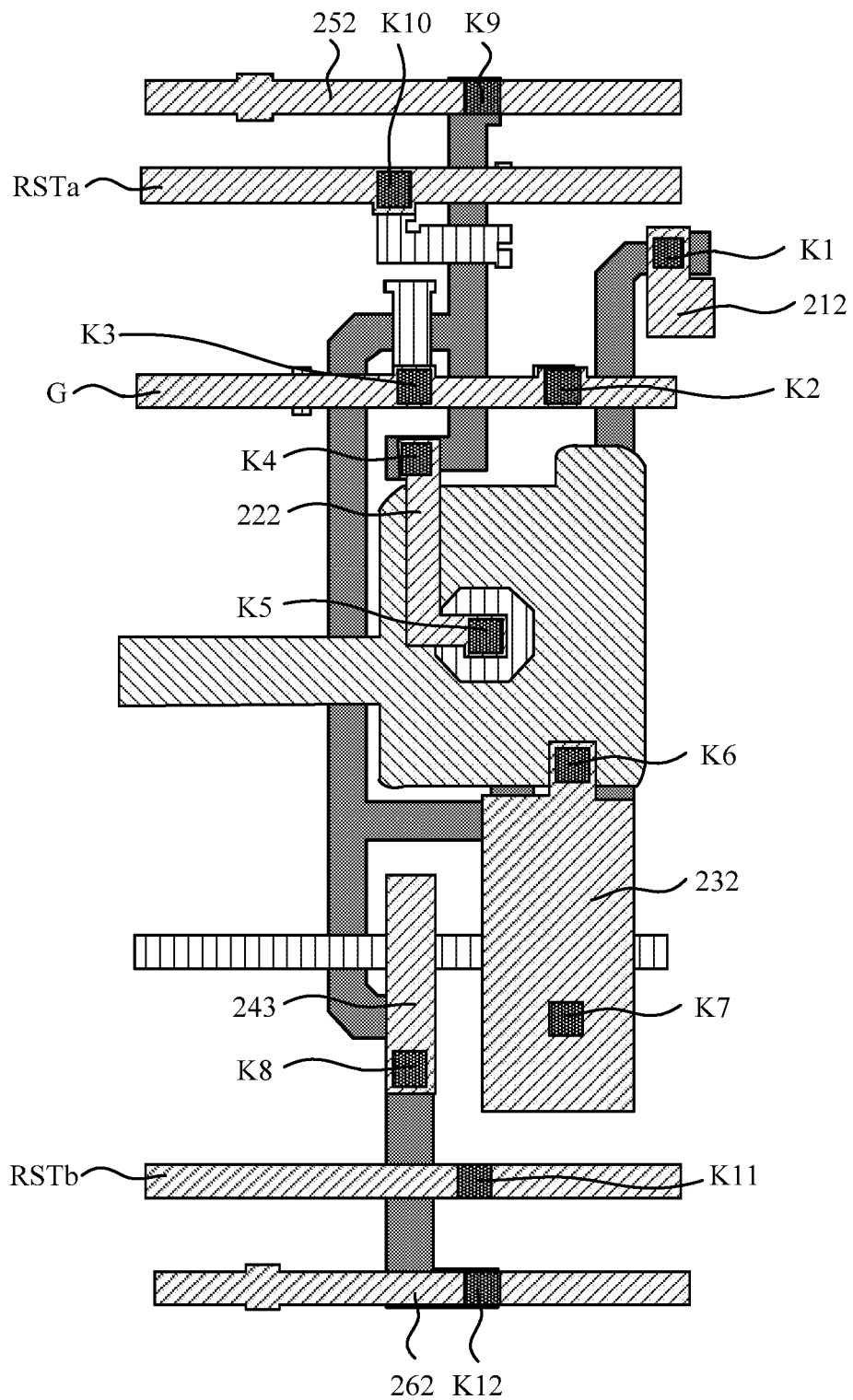
FIG. 12 is a top view of a display substrate after a third conductive layer is formed in at least one embodiment of the present disclosure.

FIG. 12 is a top view of a display substrate after a third conductive layer is formed in at least one embodiment of the present disclosure. As shown in FIGS. 7 to 12, the third conductive layer may include a scan line G, reset signal lines RSTa and RSTb, a first electrode 212 of the first switching transistor T1, a first electrode 222 of the second switching transistor T2, a first electrode 232 of the third switching transistor T3, a second electrode 243 of the fourth switching transistor T4, a first electrode 252 of the fifth switching transistor T5 and a first electrode 262 of the sixth switching transistor T6.

In the present exemplary embodiment, the scan line G may be parallel to the reset signal lines RSTa and RSTb, and a distance between the scan line G and the reset signal line RSTa may be smaller than a distance between the scan line G and the reset signal line RSTb.

In the present exemplary embodiment, the scan line G may be connected to the control electrode 211 of the first switching transistor T1 through a first via hole K2 in the third insulating layer 36 and the second insulating layer 34. The scan line G may be connected to the control electrodes 221*a* and 221*b* of the second switching transistor T2 through a first via hole K3 in the third insulating layer 36 and the second insulating layer 34. The reset signal line RSTa may be connected to the control electrodes 251*a* and 251*b* of the fifth switching transistor T5 through a first via hole K10 in the third insulating layer 36 and the second insulating layer 34. The reset signal line RSTb may be connected to the control electrode 261 of the sixth switching transistor T6 through a first via hole K11 in the third insulating layer 36 and the second insulating layer 34.

In the present exemplary embodiment, an orthographic projection of the scan line G on the substrate 30 may cover an orthographic projection of the control electrode 211 of the first switching transistor T1 on the substrate 30, and may partially overlap with orthographic projections of the control electrodes 221*a* and 221*b* of the second switching transistor T2 on the substrate 30. An orthographic projection of the reset signal line RSTa on the substrate 30 may partially overlap with orthographic projections of the control electrodes 251*a* and 251*b* of the fifth switching transistor T5 on the substrate 30. An orthographic projection of the reset signal line RSTb on the substrate 30 may cover an orthographic projection of the control electrode 261 of the sixth switching transistor T6 on the substrate 30.

In the present exemplary embodiment, the orthographic projection of the scan line G on the substrate 30 may cover orthographic projections of the first via holes K2 and K3 on the substrate 30. The orthographic projection of the reset signal line RSTa on the substrate 30 may cover an orthographic projection of the first via hole K10 on the substrate 30. The orthographic projection of the reset signal line RSTb on the substrate 30 may cover an orthographic projection of the first via hole K11 on the substrate 30.

In the present exemplary embodiment, the first electrode 212 of the first switching transistor T1 is connected to a first doped region 210*b* of the active layer 210 of the first switching transistor T1 through a third via hole K1 in the third insulating layer 36, a second insulating layer 34 and the first insulating layer 32. The first electrode 222 of the second switching transistor T2 may be connected to a first doped region 220*b* of the active layer 220 of the second switching transistor T2 through a third via hole K4 in the third insulating layer 36, a second insulating layer 34 and the first insulating layer 32, and may be connected to the control electrode 271 of the driving transistor DTFT through a first via hole K5 in the third insulating layer 36 and the second insulating layer 34. The first electrode 232 of the third switching transistor T3 may be connected to a first doped region 230*b* of the active layer 230 of the third switching transistor T3 through a third via hole K7 in the third insulating layer 36, the second insulating layer 34 and the first insulating layer 32, and may be connected to the second electrode 282 of the storage capacitor Cst through a fourth via hole K6 in the third insulating layer 36. The second electrode 243 of the fourth switching transistor T4 may be connected to a second doped region 240*c* of the active layer 240 of the fourth switching transistor T4 through a third via hole K8 in the third insulating layer 36, the second insulating layer 34 and the first insulating layer 32. The first electrode 252 of the first switching transistor T5 may be connected to a first doped region 250*b* of the active layer 250 of the fifth switching transistor T5 through a third via hole K9 in the third insulating layer 36, the second insulating layer 34 and the first insulating layer 32. The first electrode 262 of the sixth switching transistor T6 may be connected to a first doped region 260*b* of the active layer 260 of the sixth switching transistor T6 through a third via hole K12 in the third insulating layer 36, the second insulating layer 34 and the first insulating layer 32.

Figure 13:
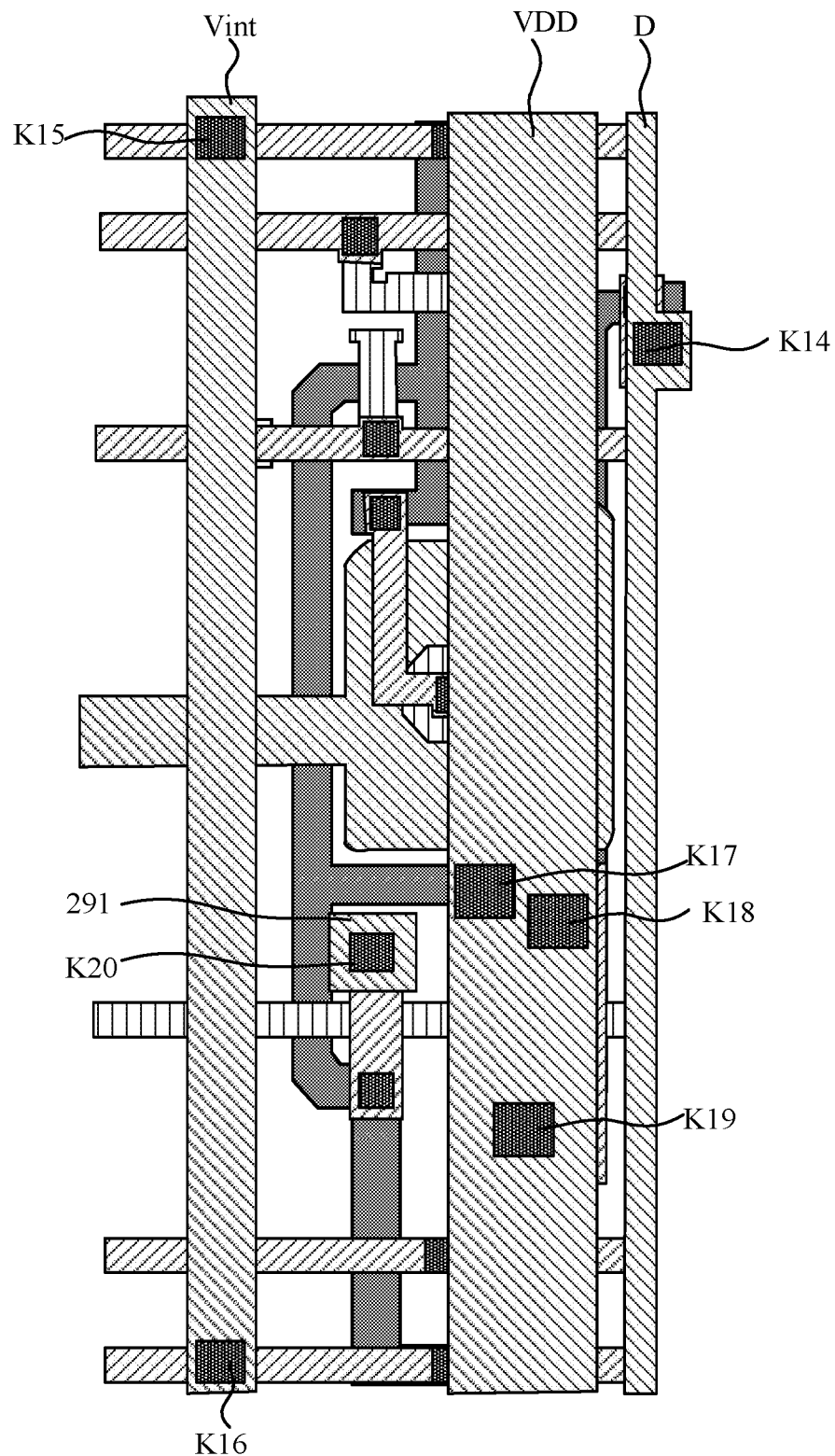
FIG. 13 is a top view of a display substrate after a fourth conductive layer is formed in at least one embodiment of the present disclosure.

FIG. 13 is a top view of a display substrate after a fourth conductive layer is formed in at least one embodiment of the present disclosure. As shown in FIGS. 7 to 13, the fourth conductive layer may include a connection electrode 291, a data line D, a first power line VDD and an initial signal line Vint. Extension directions of the data line D, the first power line VDD, and the initial signal line Vint are parallel to each other and parallel to the second direction. The width of the first power line VDD along the first direction may be greater than the width of the initial signal line Vint along the first direction, and the width of the initial signal line Vint along the first direction may be greater than the width of the first power line VDD along the first direction.

In the present exemplary embodiment, the data line D may be connected to the first electrode 212 of the first switching transistor T1 through a second via hole K14 in the fourth insulating layer 38. The first power line VDD may be connected to the first electrode 232 of the third switching transistor T3 through second via holes K17, K18, and K19 in the fourth insulating layer 38. In the present exemplary embodiment, providing of a stable power signal can be ensured by configuring a plurality of second via holes in the fourth insulating layer 38 to connect the first electrode 232 of the third switching transistor T3 and the first power line VDD. The initial signal line Vint may be connected to the first electrode 252 of the fifth switching transistor T5 through a second via hole K15 in the fourth insulating layer 38, and may be connected to the first electrode 262 of the sixth switching transistor T6 through a second via hole K16 in the fourth insulating layer 38.

In the present exemplary embodiment, the connection electrode 291 may be connected to the second electrode 243 of the fourth switching transistor T4 through a second via hole K20 in the fourth insulating layer 38. The connection electrode 291 may be connected to the anode 41 of the light-emitting element through a fifth via hole K21 in the fifth insulating layer 40.

In the present exemplary embodiment, the storage capacitor Cst may include the first electrode 281 and the second electrode 282, the second insulating layer 34 is disposed between the first electrode 281 and the second electrode 282. The first electrode 281 of the storage capacitor Cst may serve as the control electrode of driving transistor DTFT. In this example, the control electrode 271 of the driving transistor DTFT and the first electrode 281 of the storage capacitor Cst may be an integrated structure.

In the present exemplary embodiment, the driving transistor DTFT may include the active layer 270 and the control electrode 271. The active layer 270 of the driving transistor DTFT may include a first doped region 270b, a second doped region 270c and a channel region 270a connecting the first doped region 270b with the second doped region 270c. The control electrode 271 may also serve as the first electrode 281 for storing the capacitor Cst. An orthographic projection of the channel region 270a of the active layer 270 of the driving transistor DTFT on the substrate 30 may overlap with the orthographic projection of the control electrode 271 on the substrate 30. The first doped region 270b and the second doped region 270c extend in two directions relative to the channel region 270a. The first doped region 270b of the driving transistor DTFT is connected to a second doped region 210c of the active layer 210 of the first switching transistor T1. The second doped region 270c of the driving transistor DTFT is connected to a second doped region 220c of the active layer 220 of the second switching transistor T2 and a first doped region 240b of the active layer 240 of the fourth switching transistor T4.

In the present exemplary embodiment, the first switching transistor T1 may include the active layer 210, the control electrode 211 and the first electrode 212. The active layer 210 of the first switching transistor T1 may include the first doped region 210b, the second doped region 210c and a channel region 210a connecting the first doped region 210b with the second doped region 210c. The second doped region 210c of the first switching transistor T1 may be connected to the first doped region 270b of the active layer 270 of the driving transistor DTFT. The first doped region 210b of the first switching transistor T1 may be connected to the first electrode 212 of the first switching transistor T1 through the third via hole K1 in the first insulating layer 32, the second insulating layer 34 and the third insulating layer 36. The first electrode 212 of the first switching transistor T1 may be connected to the data line D through the second via hole K14 in the fourth insulating layer 38. The control electrode 211 of the first switching transistor T1 may be connected to the scan line G through the first via hole K2 in the second insulating layer 34 and the third insulating layer 36.

In the present exemplary embodiment, the second switching transistor T2 may include the active layer 220, the control electrodes 221a and 221b and the first electrode 222. The active layer 220 may include channel regions 220a1, 220a2, and 220a3, the first doped region 220b and the second doped region 220c. The channel region 220a1 corresponds to a control electrode 221a, the channel region 220a3 corresponds to a control electrode 221b, and the channel region 220a2 is located between 220a1 and 220a3. The first doped region 220b of the second switching transistor T2 may be connected to a second doped region 250c of the fifth switching transistor T5. The first doped region 220b may be connected to the first electrode 222 of the second switching transistor T2 through the third via hole K4 in the first insulating layer 32, the second insulating layer 34 and the third insulating layer 36. The first electrode 222 of the second switching transistor T2 may be connected to the control electrode 271 of the driving transistor DTFT through the first via hole K5 in the third insulating layer 36 and the second insulating layer 34. The control electrodes 221a and 221b of the second switching transistor T2 may be connected to the scan line G through the first via hole K3 in the second insulating layer 34 and the third insulating layer 36. In this example, the second switching transistor T2 can be used to prevent and reduce the occurrence of leakage currents by providing a dual-control electrode.

In the present exemplary embodiment, the third switching transistor T3 may include the active layer 230, the control electrode 231 and the first electrode 232. The active layer 230 may include a channel region 230a, the first doped region 230b and a second doped region 230c. The first doped region 230b of the third switching transistor T3 may be connected to the first electrode 232 through the third via hole K7 in the first insulating layer 32, the second insulating layer 34 and the third insulating layer 36. The first electrode 232 of the third switching transistor T3 may be connected to the first power line VDD through the second via holes K17, K18 and K19 in the fourth insulating layer 38. The first electrode 232 of the third switching transistor T3 may be connected to the second electrode 282 of the storage capacitor Cst through the fourth via hole K6 in the third insulating layer 36. The control electrode 231 of the third switching transistor T3 and the light-emitting control line EM may be an integrated structure.

In present exemplary embodiment, the fourth switching transistor T4 may include the active layer 240, the control electrode 241 and the second electrode 243. The active layer 240 of the fourth switching transistor T4 may include a channel region 240a, the first doped region 240b and the second doped region 240c. The first doped region 240b of the fourth switching transistor T4 may be connected to the second doped region 270c of the driving transistor DTFT and the second doped region 220c of the second switching transistor T2 respectively. The second doped region 240c of the fourth switching transistor T4 may be connected to the second electrode 243 of the fourth switching transistor T4 through the third via hole K8 in the first insulating layer 32, the second insulating layer 34 and the third insulating layer 36. The second electrode 243 of the fourth switching transistor T4 may be connected to the connection electrode 291 through a second via hole K20 in the fourth insulating layer 38. The connection electrode 291 may be connected to the anode 41 of the light-emitting element through a fifth via hole K21 in the fifth insulating layer 40.

In the present exemplary embodiment, the fifth switching transistor T5 may include the active layer 250, the control electrodes 251a and 221b and the first electrode 252. The active layer 250 may include channel regions 250a1, 250a2, and 220a3, the first doped region 250b and the second doped region 250c. The channel region 250a1 corresponds to a control electrode 251a, the channel region 250a3 corresponds to a control electrode 251b, and the channel region 250a2 is located between 250a1 and 250a3. The first doped region 250b may be connected to the first doped region 220b of the second switching transistor T2. The first doped region 250b of the fifth switching transistor T5 may be connected to the second electrode 252 through the third via hole K9 in the first insulating layer 32, the second insulating layer 34 and the third insulating layer 36. The control electrodes 251a and 251b of the fifth switching transistor T5 may be connected to the reset signal line RSTa through the first via hole K10 in the second insulating layer 34 and the third insulating layer 36. In this example, the fifth switching transistor T5 can be used to prevent and reduce the occurrence of leakage currents by providing a dual-control electrode.

In the present exemplary embodiment, the sixth switching transistor T6 may include the active layer 260, the control electrode 261 and the first electrode 162. The active layer 260 may include a channel region 260a, the first doped region 260b and a second doped region 260c. The first doped region 260b of the sixth switching transistor T6 may be connected to the first electrode 262 through a third via hole K12 in the first insulating layer 32, the second insulating layer 34 and the third insulating layer 36. The first electrode 262 of the sixth switching transistor T6 may be connected to the initial signal line Vint through the second via hole K16 in the fourth insulating layer 38. The second doped region 260c of the sixth switching transistor T6 may be connected to the second doped region 240c of the fourth switching transistor T4. The control electrode 261 of the sixth switching transistor T6 may be connected to the reset signal line RSTb through the first via hole K11 in the second insulating layer 34 and the third insulating layer 36.

Figure 14:
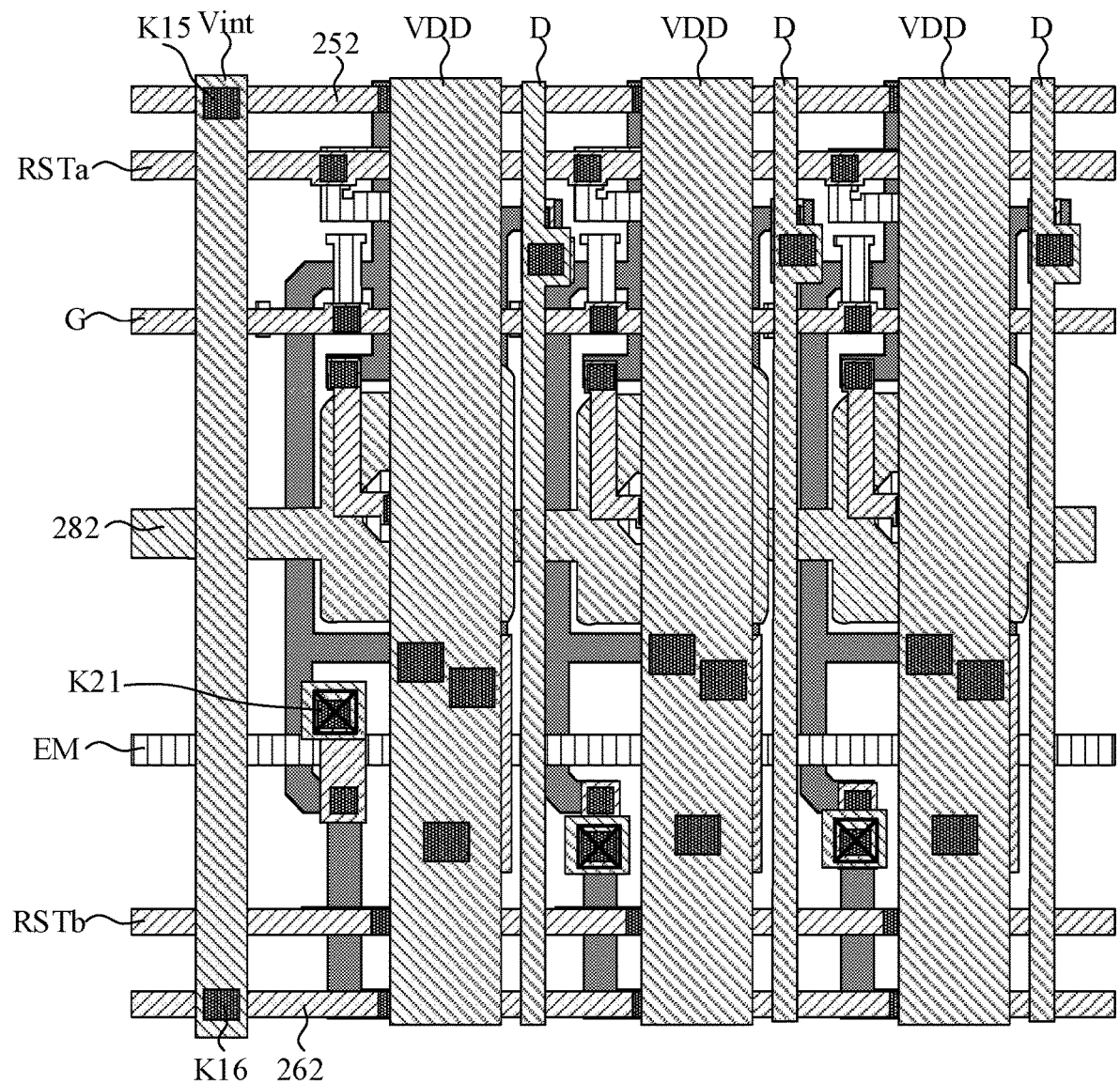
FIG. 14 is a top view of a plurality of sub-pixels of a display substrate in accordance with at least one embodiment of the present disclosure.

FIG. 14 is a top view of a plurality of sub-pixels of a display substrate in accordance with at least one embodiment of the present disclosure. As shown in FIG. 14, one row of sub-pixels may be connected to reset signal lines RSTa and RSTb in the same row and a scan line G in the same row, and one column of sub-pixels may be connected to a data line D in the same column and a first power line VDD in the same column. The first electrodes 252 of the fifth switching transistors T5 of the plurality of sub-pixels may be an integral structure and are connected to the initial signal line Vint through the second via hole K15. The first electrodes 262 of the sixth switching transistors T6 of the plurality of sub-pixels may be an integral structure and are connected to the initial signal line Vint through the second via hole K16. In this example, each row of sub-pixels can share one initial signal line Vint. However, this embodiment is not limited thereto.

In the present exemplary embodiment, the second electrodes 282 of the storage capacitors Cst of the plurality of sub-pixels may be an integral structure. However, this embodiment is not limited thereto. In some examples, the second electrodes of the storage capacitors Cst of the plurality of sub-pixels may be independent structures contacting with each other directly. Stable power signals can be transmitted between the plurality of sub-pixels by configuring the second electrodes of the storage capacitors of the plurality of sub-pixels to contact with each other directly.

A manufacturing process of a display substrate in accordance with the present exemplary embodiment will be described below with reference to FIGS. 7 to 14. "Patterning processes" mentioned in the present embodiment, which includes deposition of a film layer, photoresist coating, mask exposure, development, etching, photoresist stripping, etc., are known mature manufacturing processes. Deposition may be implemented using the known processes, such as sputtering, evaporation and chemical vapor deposition, coating may be implemented using the known coating processes, and etching may be implemented using the known methods, which are not limited herein. In the description of the present embodiment, it should be understood that "film" refers to a layer of film formed by a certain material on a substrate using deposition or other processes.

The manufacturing process of the display substrate in accordance with the present exemplary embodiment may include the following steps.

In step 100, a substrate is provided, a semiconductor film is deposited on the substrate, and the semiconductor film is processed through the patterning processes to form a semiconductor layer, as shown in FIG. 9.

In the present exemplary embodiment, the substrate may be a rigid substrate or a flexible substrate. The rigid substrate may be made of one or more of glass and metal foil sheet. The flexible substrate may be made of one or more of polyethylene terephthalate, ethylene terephthalate, polyether ether ketone, polystyrene, polycarbonate, polyarylate, polyarylester, polyimide, polyvinyl chloride, polyethylene and textile fibers.

In the present exemplary embodiment, a manufacturing material of the semiconductor layer may be polysilicon or metal oxide, which is not limited in the embodiments of the present disclosure.

In step 200, a first insulating film is deposited on the semiconductor layer, the first insulating film is processed through the patterning processes to form a first insulating layer, a first conductive film is deposited on the first insulating layer, and the first conductive film is processed through the patterning processes to form a first conductive layer, as shown in FIG. 10.

In the present exemplary embodiment, the first conductive layer may include a light-emitting control line EM, a control electrode 211 of a first switching transistor T1, control electrodes 221a and 221b of a second switching transistor T2, a control electrode 231 of a third switching transistor T3, a control electrode 241 of a fourth switching transistor T4, control electrodes 251a and 251b of a fifth switching transistor T5, a control electrode 261 of a sixth switching transistor T6, a control electrode 271 of a driving transistor DTFT and a first electrode 281 of a storage capacitor Cst.

In the present exemplary embodiment, the first conductive film may be made of metal materials, such as silver (Ag), copper (Cu), aluminum (Al), molybdenum (Mo), etc., or alloy materials of the above metals, such as aluminum neodymium (AlNd) alloy, molybdenum niobium (MoNb) alloy, etc., and may be a multi-layer stacked structure, such as Mo/Cu/Mo, Mo/Al/Mo, etc., or may be a stacked structure formed from metal and transparent conductive materials, such as ITO/Ag/ITO, etc. The first insulating film may be made of silicon oxide (SiOx), silicon nitride (SiNx), silicon oxynitride (SiON), etc., or be made of a material with high dielectric constant (High k), such as aluminum oxide (AlOx), hafnium oxide (HfOx), tantalum oxide (TaOx), etc., and may be a single layer, multiple layers or a composite layer. Generally, the first insulating layer 32 may be referred to as a gate insulating (GI) layer.

In step 300, a second insulating film is deposited on the first conductive layer, the second insulating film is processed through the patterning processes to form a second insulating layer, a second conductive film is deposited on the second insulating layer, and the second conductive film is processed through the patterning processes to form a second conductive layer, as shown in FIG. 11.

In the present exemplary embodiment, the second conductive layer may include a second electrode 282 of the storage capacitor Cst.

In the present exemplary embodiment, the second conductive film may be made of metal materials, such as silver (Ag), copper (Cu), aluminum (Al), molybdenum (Mo), etc., or alloy materials of the above metals, such as aluminum neodymium (AlNd) alloy, molybdenum niobium (MoNb)

alloy, etc., and may be a multi-layer stacked structure, such as Mo/Cu/Mo, Mo/Al/Mo, etc., or may be a stacked structure formed from metal and transparent conductive materials, such as ITO/Ag/ITO, etc. The second insulating film may be made of silicon oxide (SiOx), silicon nitride (SiNx), silicon oxynitride (SiON), etc., or be made of a material with high dielectric constant (High k), such as aluminum oxide (AlOx), hafnium oxide (HfOx), tantalum oxide (TaOx), etc., and may be a single layer, multiple layers or a composite layer. Generally, the second insulating layer 34 may be referred to as a gate insulating (GI) layer.

In step 400, a third insulating film is deposited on the second conductive layer, the third insulating film is processed through the patterning processes to form a third insulating layer, a third conductive film is deposited on the third insulating layer, and the third conductive film is processed through the patterning processes to form a third conductive layer, as shown in FIG. 12.

In the present exemplary embodiment, the third conductive layer may include a scan line G, reset signal lines RSTa and RSTb, a first electrode 212 of the first switching transistor T1, a first electrode 222 of the second switching transistor T2, a first electrode 232 of the third switching transistor T3, a second electrode 243 of the fourth switching transistor T4, a first electrode 252 of the fifth switching transistor T5 and a first electrode 262 of the sixth switching transistor T6.

In the present exemplary embodiment, the third conductive film may be made of metal materials, such as silver (Ag), copper (Cu), aluminum (Al), molybdenum (Mo), etc., or alloy materials of the above metals, such as aluminum neodymium (AlNd) alloy, molybdenum niobium (MoNb) alloy, etc., and may be a multi-layer stacked structure, such as Ti/Al/Ti, etc., or may be a stacked structure formed from metal and transparent conductive materials, such as ITO/Ag/ITO, etc. The third insulating film may be made of silicon oxide (SiOx), silicon nitride (SiNx), silicon oxynitride (SiON), etc., or be made of a material with high dielectric constant (High k), such as aluminum oxide (AlOx), hafnium oxide (HfOx), tantalum oxide (TaOx), etc., and may be a single layer, multiple layers or a composite layer. Generally, the third insulating layer 36 may be referred to as a interlayer insulating layer.

In step 500, a fourth insulating film is deposited on the third conductive layer, the fourth insulating film is processed through the patterning processes to form a fourth insulating layer, a fourth conductive film is deposited on the fourth insulating layer, and the fourth conductive film is processed through the patterning processes to form a fourth conductive layer, as shown in FIG. 13.

In the present exemplary embodiment, the fourth conductive layer may include a connection electrode 291, a data line D, a first power line VDD and an initial signal line Vint.

In the present exemplary embodiment, the fourth conductive film may be made of metal materials, such as silver (Ag), copper (Cu), aluminum (Al), molybdenum (Mo), etc., or alloy materials of the above metals, such as aluminum neodymium (AlNd) alloy, molybdenum niobium (MoNb) alloy, etc., and may be a multi-layer stacked structure, such as Mo/Cu/Mo, Mo/Al/Mo, etc., or may be a stacked structure formed from metal and transparent conductive materials, such as ITO/Ag/ITO, etc. The fourth insulating film may be made of silicon oxide (SiOx), silicon nitride (SiNx), silicon oxynitride (SiON), etc., or be made of a material with high dielectric constant (High k), such as aluminum oxide (AlOx), hafnium oxide (HfOx), tantalum oxide (TaOx), etc., and may be a single layer, multiple layers or a composite layer.

In step 600, a fifth insulating layer is formed on the fourth conductive layer, a fifth conductive film is deposited on the fifth insulating layer, and the fifth conductive film is processed through the patterning processes to form a fifth conductive layer; a pixel definition film is coated on the fifth conductive layer, and patterns of a pixel definition layer 42 are formed by mask exposure and development to define an opening area exposing an anode 41 of a light-emitting element. An organic light-emitting layer 43 is formed in the opening region, a sixth conductive film is deposited on the organic light-emitting layer, and the sixth conductive film is processed through the patterning processes to form a cathode 44 of the light-emitting element, as shown in FIG. 8.

In the present exemplary embodiment, the fifth insulating layer may include an inorganic insulating layer and an organic insulating layer which are stacked. A material of the inorganic insulating layer may include silicon oxide (SiOx), silicon nitride (SiNx), silicon oxynitride (SiON), etc.; a material of the organic insulating layer may include polyimide, acrylic or polyethylene terephthalate.

In the present exemplary embodiment, the pixel definition film may be made of polyimide, acrylic or polyethylene terephthalate.

In the present exemplary embodiment, the organic light-emitting layer 43 may mainly include a light-emitting material layer (EML). In some examples, the organic emitting layer may include a hole injection layer, a hole transport layer, a light-emitting material layer, an electron transport layer and an electron injection layer that are disposed sequentially, to improve the efficiency of injection of electrons and holes into the light-emitting layer.

In some examples, the anode 41 of the light-emitting element may be made of at least one of transparent conductive materials, such as indium tin oxide (ITO), indium zinc oxide (IZO), zinc oxide (ZnO), indium gallium oxide (IGO) and aluminum zinc oxide (AZO). A cathode 44 of the light-emitting element may be made of silver (Ag), magnesium (Mg), aluminum (Al), platinum (Pt), palladium (Pd), gold (Au), nickel (Ni), neodymium (Nd), iridium (Ir), chromium (Cr) or a compound thereof. However, this embodiment is not limited thereto.

In the display substrate in accordance with the present exemplary embodiment, the scan line G (for providing scan signals to the sub-pixels) and the reset signal lines (for providing reset signals to the sub-pixels) connected to a scan driving circuit and extending along the first direction are disposed on the third conductive layer, and signals transmitted by the scan line and the reset signal lines are transmitted back to the first conductive layer through a punching method, to implement connection with the control electrodes of the transistors arranged on the first conductive layer. In the present exemplary embodiment, impedances of the scan line and the reset signal lines extending along the first direction can be decreased by arranging the scan line and the reset signal lines on the same layer as the first electrodes and second electrodes of the transistors, thereby reducing the gate drive delay duration, improving the charging ratio of the display substrate, and further improving the resolution and refresh rate of the display substrate. Moreover, direct intersection with the scan line and the reset signal lines can be avoided by arranging the first power line VDD, the data line D and the initial signal line Vint extending along the second direction on the fourth conductive layer.

Figure 15:
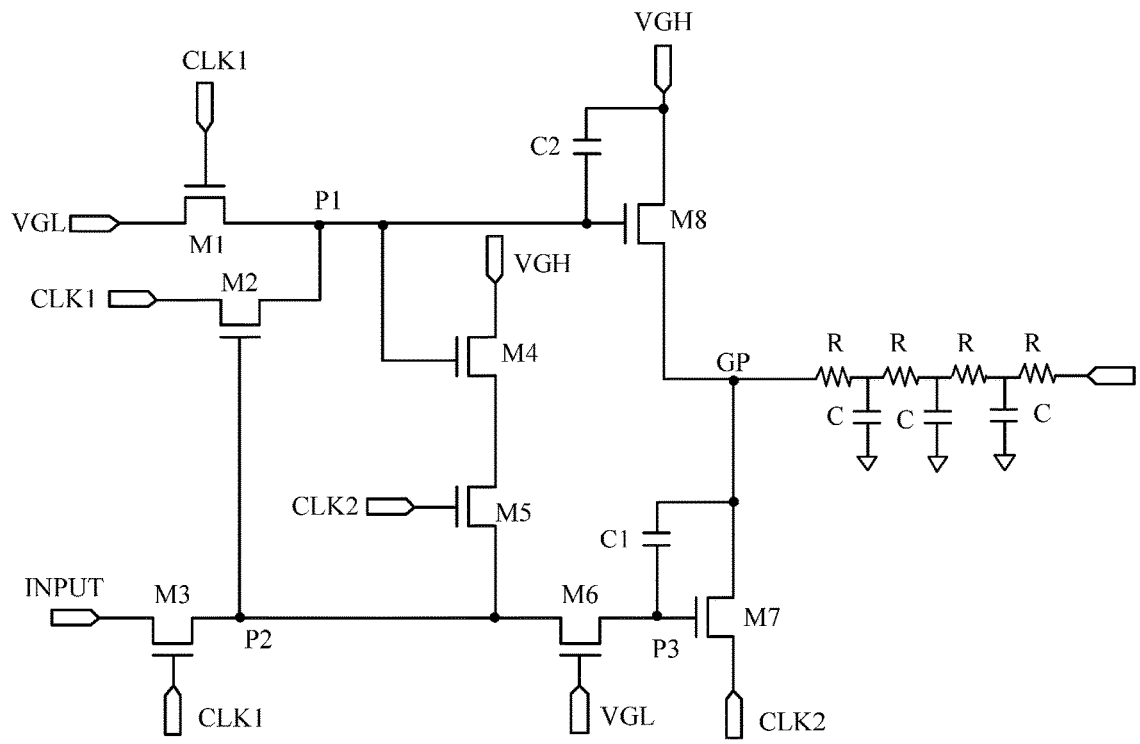
FIG. 15 is a simulation principle diagram of gate driving of a display substrate in accordance with at least one embodiment of the present disclosure.

FIG. 15 is a simulation principle diagram of gate driving of a display substrate in accordance with at least one embodiment of the present disclosure. As shown in FIG. 15, first signal lines, which are used for transmitting signals provided by the scan driving circuit to the sub-pixels in a display region of the display substrate, may be represented using a simulation circuit including resistors and capacitors. In this example, the first signal lines transmitting the signals in a display region may be simulated using a circuit including four resistors R and three capacitors C. The four resistors are connected in series from an output terminal GP of a shift register unit, and one end of a capacitor C is connected between two adjacent resistors, and the other end of the capacitor C is grounded. However, this embodiment is not limited thereto. In some examples, the simulation circuitry of the first signal lines in the display region may include 5 resistors R and 4 capacitors C.

In an example, when the first signal lines in the display region are arranged on the same layer as the control electrodes of the transistors, and the material of the control electrode layer may be Mo/Al/Mo, for example, the total resistance of the first signal lines in the display region obtained by simulation is 54.32 kilohms (kΩ) and the total capacitance is 175.95 picofarads (pF). When the first signal lines in the display region are arranged on the same layer as the first electrodes and the second electrodes of the transistors, and a material of this layer may be Ti/Al/Ti, for example, the total resistance of the first signal lines in the display region obtained by simulation is 4.12 kΩ and the total capacitance is 161.49 pF. It follows that in the present exemplary embodiment, the resistance on the first signal lines can be greatly reduced and the impedance of the gate electrode layer can be greatly reduced by arranging the first signal lines on the same layer as the first electrodes and the second electrodes of the transistors.

Figure 16:
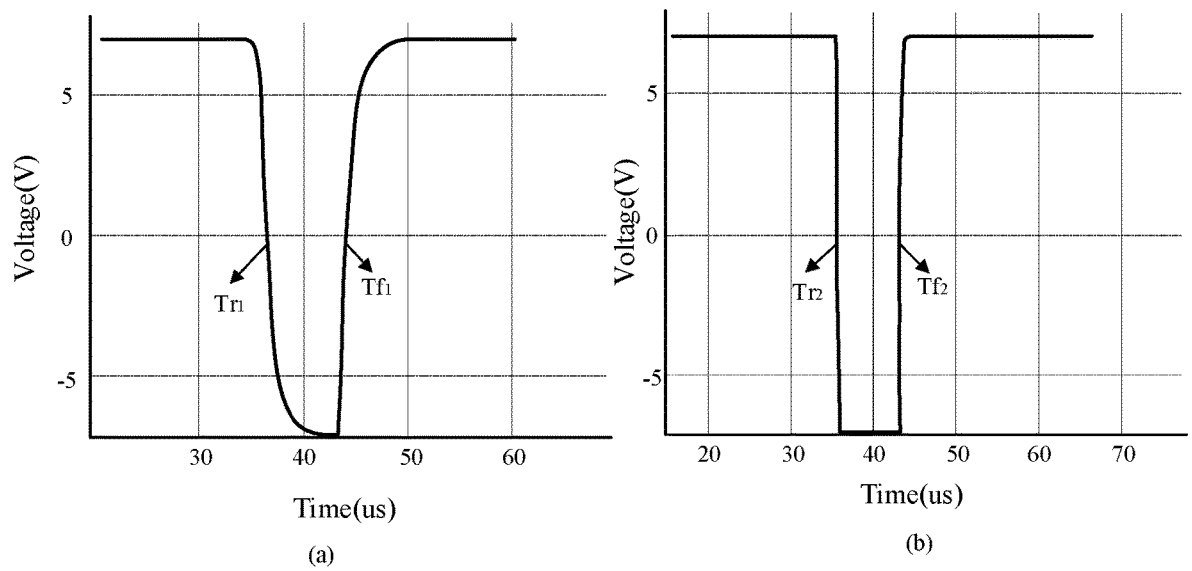
FIG. 16 includes FIGS. 16 (a) and 16 (b) which are schematic diagrams of gate drive delay.

FIG. 16 includes FIGS. 16 (a) and 16 (b) which are schematic diagrams of gate drive delay. FIG. 16 (a) shows a schematic diagram of gate drive delay when a first signal line is arranged on the same layer as the control electrodes of the transistors. FIG. 16 (b) shows a schematic diagram of gate drive delay when the first signal line is arranged on the same layer as the first electrodes and the second electrodes of the transistors. FIGS. 16 (a) and 16 (b) are schematic diagrams of gate drive delay simulated under the condition of VGH=7V at a first power terminal and VGL=−7V at a second power terminal of the shift register unit shown in FIG. 15. As shown in FIG. 16 (a), when the first signal line is arranged on the same layer as the control electrodes of the transistors, a falling edge duration of a signal transmitted by the first signal line is $Tr_1$ 32 2.3 microseconds (µs), a rising edge duration is $TF_1$=2.38 µs, and a signal delay duration is 4.68 µs. As shown in FIG. 16 (b), when the first signal line is arranged on the same layer as the first electrodes and second electrodes of the transistors, the falling edge duration of the signal transmitted by the first signal line is $Tr_2$=0.27 µs, the rising edge duration is $TF_2$=0.26 µs, and the signal delay duration is 0.53 µs. For the display substrate with the resolution being 2560*1920 and the refresh frequency being 60 Hz, a scanning duration of one frame is 1/60 Hz=16.67 ms, and a scanning duration of one row is 16.67 ms/1920=8.6 µs. An effective charging duration of a sub-pixel in the display substrate, in which the first signal line is arranged on the same layer as the control electrodes of the transistors, is 8.6−4.68=3.92 µs, and an effective charging duration of the sub-pixel in the display substrate, in which the first signal line is arranged on the same layer as the first electrodes and the second electrodes of the transistors, can be 8.6− 0.53=8.07 µs. It follows that in the display substrate in accordance with the present embodiment, the effective charging duration can be greatly prolonged by arranging the first signal line on the same layer as the first electrodes and the second electrodes of the transistors, thereby meeting the high resolution requirement.

In some examples, the driving circuit of the sub-pixel is simulated under the condition of VGH=7V, VGL=−7V and a data voltage value Vb=2.56V. The charging ratio of the display substrate in accordance with the present exemplary embodiment can be obtained according to a simulation result of the driving circuit of the sub-pixel and a calculation formula of the charging ratio. The calculation formula of the charging ratio is:

$$\text{Charging Ratio} = \frac{(VG_{Light\_on} - Vinit)}{(VData_{Light\_on} - Vth - Vinit)} * 100\%$$

wherein, $VG_{Light\_on}$ represents an electric potential of a first node N1 in the driving circuit when the light-emitting element is lit, that is, a voltage of the control electrode of the driving transistor DTFT; Vinit represents a voltage value provided by the initial signal line Vint; $VData_{light\_on}$ represents a data voltage value provided by the data line D when the light-emitting element is lit, and Vth represents a threshold voltage of the driving transistor DTFT.

Take a pixel including RGB sub-pixels as an example, when the first signal line of the display substrate with the resolution being 2560*1920 and the refresh frequency being 60 Hz is arranged on the same layer as gate electrodes, charging ratios of sub-pixels of R, G and B, which are 71.2%, 70.3% and 68% respectively, can be obtained according to the simulation result. The charging ratios are all less than 75%, indicating that the charging ratio of the display substrate, in which the first signal line is arranged on the same layer as the gate electrodes, is insufficient at 60 Hz, such that the product requirements cannot be met. When the first signal line of the display substrate with the resolution being 2560*1920 and the refresh frequency being 60 Hz is arranged on the same layer as source and drain electrodes, the charging ratios of sub-pixels of R, G and B, which are 85%, 85% and 84% respectively, can be obtained according to the simulation result. The charging ratios are all greater than 75%, indicating that the charging ratio of the display substrate in accordance with the present exemplary embodiment is sufficient at 60 Hz. Moreover, the display substrate with the resolution being 2560*1920 and the refresh frequency being 90 Hz is simulated, the charging ratios of R, G and B sub-pixels, which are 78.9%, 79.4% and 78.1% respectively, can be obtained according to the simulation result. The charging ratios are all greater than 75%, indicating that the charging ratio of the display substrate in accordance with the present exemplary embodiment is relatively sufficient at 90 Hz. It follows that the refresh frequency can be improved in the display substrate in accordance with this embodiment.

Figure 17:
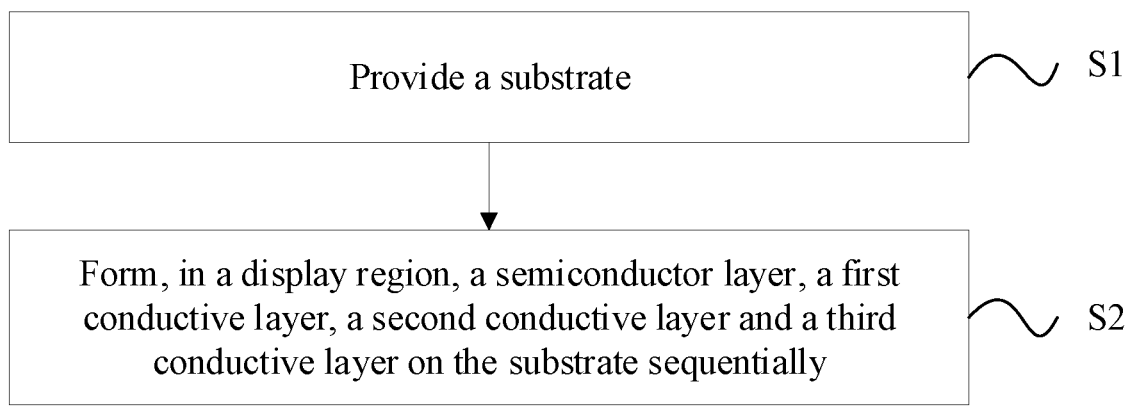
FIG. 17 is a schematic flowchart of a manufacturing method of a display substrate in accordance with at least one embodiment of the present disclosure.

FIG. 17 is a schematic flowchart of a manufacturing method of a display substrate in accordance with at least one embodiment of the present disclosure. As shown in FIG. 17, the manufacturing method of the display substrate in accordance with at least one embodiment of the present disclosure, which is used for manufacturing the display substrate as described above, includes the following steps: in step S1, providing a substrate; and in step S2, forming, in a display region, a semiconductor layer, a first conductive layer, a second conductive layer and a third conductive layer on the substrate sequentially. The semiconductor layer may include active layers of a plurality of transistors. The first conductive layer may include control electrodes of the plurality of transistors and a first electrode of a storage capacitor. The second conductive layer may include a second electrode of the storage capacitor. The third conductive layer may include a plurality of first signal lines and first electrodes and second electrodes of the plurality of transistors. First via holes may be provided in an insulating layer between the third conductive layer and the first conductive layer, and the first signal lines may contact the control electrodes of the transistors of the first conductive layer, the control electrodes are exposed through the first via holes.

In some exemplary implementations, the aforementioned manufacturing method further includes forming a fourth conductive layer at one side of the third conductive layer away from the substrate. The fourth conductive layer may include a plurality of second signal lines extending along a second direction perpendicular to a first direction. Second via holes may be provided in an insulating layer between the fourth conductive layer and the third conductive layer, and the second signal lines may contact the first electrodes or the second electrodes of the transistors of the third conductive layer, the first electrodes or the second electrodes are exposed through the second via holes.

In some exemplary implementations, forming the semiconductor layer, the first conductive layer, the second conductive layer and the third conductive layer on the substrate sequentially may include: forming the semiconductor layer and a first insulating layer on the substrate sequentially; forming the first conductive layer and a second insulating layer on the first insulating layer sequentially; forming the second conductive layer and a third insulating layer on the second insulating layer sequentially; forming the third conductive layer and a fourth insulating layer on the third insulating layer sequentially; and forming the fourth conductive layer on the fourth insulating layer.

In some exemplary implementations, after the fourth conductive layer is formed, the manufacturing method in accordance with the present embodiment may further include: forming a fifth insulating layer on the fourth conductive layer; and forming a fifth conductive layer, and an organic light-emitting layer and a second electrode of a light-emitting element on the fifth insulating layer sequentially, the fifth conductive layer including a first electrode of the light-emitting element.

The manufacturing process of the display substrate in accordance with in this embodiment can be referred to the description of the previous embodiments, and thus will not be repeated herein.

Figure 18:
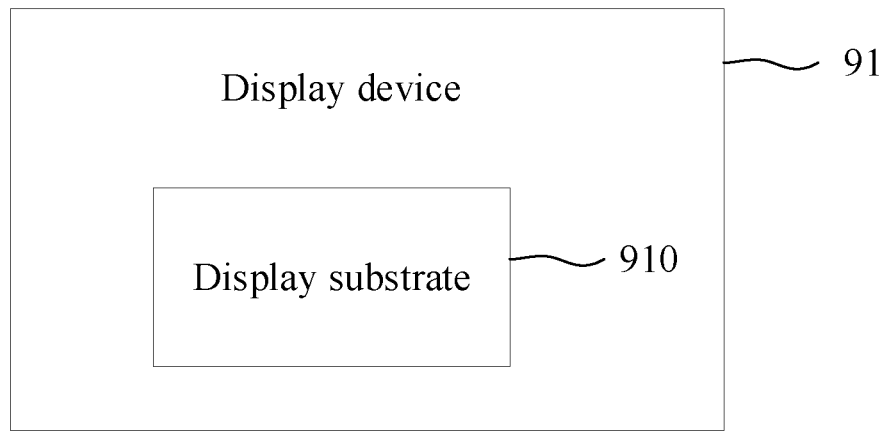
FIG. 18 is a schematic diagram of a display device in accordance with at least one embodiment of the present disclosure.

FIG. 18 is a schematic diagram of a display device in accordance with at least one embodiment of the present disclosure. As shown in FIG. 18, the display device 91 in accordance with at least one embodiment of the present disclosure includes a display substrate 910. The display substrate 910 is the display substrate in accordance with the embodiment described above, and their implementation principles and implementation effects are similar, and will not be repeated herein. In some examples, the display substrate 910 may be an OLED display substrate. In some examples, the display device 91 may be any product or component with a display function, such as an OLED display device, a mobile phone, a tablet computer, a television, a display, a notebook computer, a digital photo frame or a navigator. This embodiment is not limited thereto.

Although the implementations disclosed in the present disclosure are described as above, the described contents are only implementations which are used in order to facilitate understanding of the present disclosure, and are not intended to limit the present disclosure. Any skilled person in the art to which the present disclosure pertains can make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising: a display region and a peripheral region located at a periphery of the display region, wherein:
    a scan driving circuit is provided in the peripheral region, and a plurality of sub-pixels and a plurality of first signal lines are provided in the display region, the plurality of first signal lines are connected to the scan driving circuit and extend along a first direction;
    at least one of the plurality of sub-pixels comprises a light-emitting element and a driving circuit used for driving the light-emitting element to emit light, the driving circuit comprising a plurality of transistors and a storage capacitor;
    the display region comprises a substrate, and a semiconductor layer, a first conductive layer, a second conductive layer and a third conductive layer which are sequentially disposed on the substrate;
    the semiconductor layer comprises active layers of the plurality of transistors;
    the first conductive layer comprises control electrodes of the plurality of transistors and a first electrode of the storage capacitor;
    the second conductive layer comprises a second electrode of the storage capacitor; and
    the third conductive layer comprises the plurality of first signal lines and first electrodes and second electrodes of the plurality of transistors; first via holes are provided in an insulating layer disposed between the third conductive layer and the first conductive layer, and the first signal lines are in contact with the control electrodes of the transistors of the first conductive layer, and the control electrodes are exposed through the first via holes.

2. The display substrate according to claim 1, wherein the display region further comprises a fourth conductive layer disposed at a side of the third conductive layer away from the substrate; and
    the fourth conductive layer comprises a plurality of second signal lines extending along a second direction perpendicular to the first direction; second via holes are provided in an insulating layer disposed between the fourth conductive layer and the third conductive layer, and the second signal lines are in contact with the first electrodes or the second electrodes of the transistors of the third conductive layer, the first electrodes or the second electrodes are exposed through the second via holes.

3. The display substrate according to claim 2, wherein the second signal lines comprise data lines, first power lines and initial signal lines.

4. The display substrate according to claim 3, wherein the display region further comprises a first insulating layer, a second insulating layer, a third insulating layer and a fourth insulating layer, wherein the first insulating layer is disposed between the semiconductor layer and the first conductive layer, the second insulating layer is disposed between the first conductive layer and the second conductive layer, the third insulating layer is disposed between the second conductive layer and the third conductive layer, and the fourth insulating layer is disposed between the third conductive layer and the fourth conductive layer.

5. The display substrate according to claim 3, wherein for at least one sub-pixel, the plurality of transistors of the driving circuit comprise a first switching transistor to a sixth switching transistor and a driving transistor;

wherein a control electrode of the first switching transistor is connected to a scan line, a first electrode of the first switching transistor is connected to the data line, and a second electrode of the first switching transistor is connected to a first electrode of the driving transistor; a control electrode of the second switching transistor is connected to the scan line, a first electrode of the second switching transistor is connected to the data line, and a second electrode of the second switching transistor is connected to a second electrode of the driving transistor; a control electrode of the third switching transistor is connected to a light-emitting control line, a first electrode of the third switching transistor is connected to the first power line, and a second electrode of the third switching transistor is connected to the first electrode of the driving transistor; a control electrode of the fourth switching transistor is connected to the light-emitting control line, a first electrode of the fourth switching transistor is connected to the second electrode of the driving transistor, and a second electrode of the fourth switching transistor is connected to a first electrode of the light-emitting element; a control electrode of the fifth switching transistor is connected to a reset signal line, a first electrode of the fifth switching transistor is connected to the initial signal line, and a second electrode of the fifth switching transistor is connected to the first electrode of the second switching transistor; a control electrode of the sixth switching transistor is connected to another reset signal line, a first electrode of the sixth switching transistor is connected to the initial signal line, and a second electrode of the sixth switching transistor is connected to the first electrode of the light-emitting element; and the first electrode of the storage capacitor is connected to a control electrode of the driving transistor, and a second electrode of the storage capacitor is connected to the first power line.

6. The display substrate according to claim 5, wherein the reset signal line, to which the control electrode of the fifth switching transistor is connected, and the reset signal line, to which the control electrode of the sixth switching transistor is connected, are located respectively at both sides of the scan line, to which the control electrodes of the first switching transistor and the second switching transistor are connected.

7. The display substrate according to claim 5, wherein second electrodes of storage capacitors located in adjacent sub-pixels of a same row are in direct contact.

8. The display substrate according to claim 5, wherein the first electrode of the storage capacitor and the control electrode of the driving transistor are an integral structure; and the second electrode of the storage capacitor has a hollowed area, an orthographic projection of the control electrode of the driving transistor on the substrate covers an orthographic projection of the hollowed area on the substrate, and the first electrode of the second switching transistor is connected to the control electrode of the driving transistor through the hollowed area.

9. The display substrate according to claim 5, wherein the display region further comprises a fifth conductive layer, a fifth insulating layer disposed between the fourth conductive layer and the fifth conductive layer, and an organic light-emitting layer and a second electrode of the light-emitting element disposed at a side of the fifth conductive layer away from the substrate;

the fifth conductive layer comprises the first electrode of the light-emitting element; and the second electrode of the light-emitting element is disposed at a side of the organic light-emitting layer away from the substrate.

10. The display substrate according to claim 1, wherein the third conductive layer comprises a three-layer stacked structure formed from titanium, aluminum and titanium.

11. The display substrate according to claim 1, wherein an orthographic projection of the first signal lines on the substrate are at least partially overlapped with an orthographic projection of a control electrode of a transistor connected to the first signal lines on the substrate.

12. The display substrate according to claim 1, wherein a plurality of the first via holes are provided along an extension direction of the first signal lines, and an orthographic projection of the first via holes on the substrate is covered by an orthographic projection of the first signal lines on the substrate covers.

13. The display substrate according to claim 1, wherein the first signal lines comprise scan lines, the scan driving circuit comprises a plurality of cascaded shift register units, an ith stage shift register unit provides scan signals to an ith row of sub-pixels through the scan lines, wherein i is an integer greater than 0.

14. The display substrate according to claim 13, wherein the first signal lines further comprise reset signal lines, the ith stage shift register unit provides reset signals to an (i+1)th row of sub-pixels through the reset signal lines.

15. The display substrate according to claim 13 or 14, wherein the shift register unit comprises a first transistor to an eighth transistor, a first capacitor and a second capacitor, wherein a control electrode of the first transistor is connected to a first clock signal terminal, a first electrode of the first transistor is connected to a first voltage terminal, and a second electrode of the first transistor is connected to a first control node; a control electrode of the second transistor is connected to a second control node, a first electrode of the second transistor is connected to the first clock signal terminal, and a second electrode of the second transistor is connected to the first control node; a control electrode of the third transistor is connected to the first clock signal terminal, a first electrode of the third transistor is connected to a signal input terminal, and a second electrode of the third transistor is connected to the second control node; a control electrode of the fourth transistor is connected to the first control node, a first electrode of the fourth transistor is connected to a second voltage terminal, and a second electrode of the fourth transistor is connected to a first electrode of the fifth transistor; a control electrode of the fifth transistor is connected to a second clock signal terminal, and a second electrode of the fifth transistor is connected to the second control node; a control electrode of the sixth transistor is connected to the first voltage terminal, a first electrode of the sixth transistor is connected to the second control node, and a second electrode of the sixth transistor is connected to a third control node; a control electrode of the seventh transistor is connected to the third control node, a first electrode of the seventh transistor is connected to an output terminal, and a second electrode of the seventh transistor is connected to the second clock signal terminal; a control electrode of the eighth transistor is connected to the first control node, a first electrode of the eighth transistor is connected to the second voltage terminal, and a second electrode of the eighth transistor is connected to the output terminal; and a first electrode of the first capacitor is connected to the output terminal, and a second electrode of the first capacitor is connected to the third control node; a first electrode of the second capacitor is connected to the second voltage terminal, and a second electrode of the second capacitor is connected to the first control node.

16. The display substrate according to claim 13, wherein a light-emitting driving circuit is further provided in the peripheral region, a plurality of light-emitting control lines connected to the light-emitting driving circuit and extending along the first direction are further provided in the display region, and the light-emitting driving circuit provides light-emitting control signals to the sub-pixels through the light-emitting control lines; and the first conductive layer further comprises a plurality of light-emitting control lines; the light-emitting control lines and a control electrode of at least one transistor in the driving circuits of a row of sub-pixels are an integrated structure.

17. A display device, comprising the display substrate according to claim 1.

18. A manufacturing method for a display substrate, used for manufacturing the display substrate according to claim 1, the method comprising:

providing the substrate; and forming, in the display region, the semiconductor layer, the first conductive layer, the second conductive layer and the third conductive layer on the substrate sequentially, wherein the semiconductor layer comprises the active layers of the plurality of transistors; the first conductive layer comprises the control electrodes of the plurality of transistors and the first electrode of the storage capacitor; the second conductive layer comprises the second electrode of the storage capacitor; the third conductive layer comprises the plurality of first signal lines and the first electrodes and the second electrodes of the plurality of transistors; the first via holes are provided in the insulating layer disposed between the third conductive layer and the first conductive layer, and the first signal lines are in contact with the control electrodes of the transistors of the first conductive layer, the control electrodes are exposed through the first via holes.

19. The manufacturing method according to claim 18, further comprising: forming a fourth conductive layer at a side of the third conductive layer away from the substrate, wherein the fourth conductive layer comprises a plurality of second signal lines extending along a second direction perpendicular to a first direction, second via holes are provided in an insulating layer disposed between the fourth conductive layer and the third conductive layer, and the second signal lines are in contact with the first electrodes or the second electrodes of the transistors of the third conductive layer, the first electrodes or the second electrodes are exposed through the second via holes.

20. The manufacturing method according to claim 19, wherein forming the semiconductor layer, the first conductive layer, the second conductive layer and the third conductive layer on the substrate sequentially comprises:

forming the semiconductor layer and a first insulating layer on the substrate sequentially;

forming the first conductive layer and a second insulating layer on the first insulating layer sequentially;

forming the second conductive layer and a third insulating layer on the second insulating layer sequentially;

forming the third conductive layer and a fourth insulating layer on the third insulating layer sequentially; and forming the fourth conductive layer on the fourth insulating layer, wherein after the fourth conductive layer is formed, the manufacturing method further comprises:

forming a fifth insulating layer on the fourth conductive layer; and forming a fifth conductive layer and an organic light-emitting layer and a second electrode of the light-emitting element on the fifth insulating layer sequentially, the fifth conductive layer comprising a first electrode of the light-emitting element.

* * * * *

UNITED STATES PATENT AND TRADEMARK OFFICE
CERTIFICATE OF CORRECTION

PATENT NO. : 11,847,967 B2
APPLICATION NO. : 17/788319
DATED : December 19, 2023
INVENTOR(S) : Mengyue Fan et al.

It is certified that error appears in the above-identified patent and that said Letters Patent is hereby corrected as shown below:

In the Claims

Column 30, Line 43-Column 31, Line 21 Claim 15 should be as shown below:
15. The display substrate according to claim 13, wherein the shift register unit comprises a first transistor to an eighth transistor, a first capacitor and a second capacitor, wherein a control electrode of the first transistor is connected to a first clock signal terminal, a first electrode of the first transistor is connected to a first voltage terminal, and a second electrode of the first transistor is connected to a first control node; a control electrode of the second transistor is connected to a second control node, a first electrode of the second transistor is connected to the first clock signal terminal, and a second electrode of the second transistor is connected to the first control node; a control electrode of the third transistor is connected to the first clock signal terminal, a first electrode of the third transistor is connected to a signal input terminal, and a second electrode of the third transistor is connected to the second control node; a control electrode of the fourth transistor is connected to the first control node, a first electrode of the fourth transistor is connected to a second voltage terminal, and a second electrode of the fourth transistor is connected to a first electrode of the fifth transistor; a control electrode of the fifth transistor is connected to a second clock signal terminal, and a second electrode of the fifth transistor is connected to the second control node; a control electrode of the sixth transistor is connected to the first voltage terminal, a first electrode of the sixth transistor is connected to the second control node, and a second electrode of the sixth transistor is connected to a third control node; a control electrode of the seventh transistor is connected to the third control node, a first electrode of the seventh transistor is connected to an output terminal, and a second electrode of the seventh transistor is connected to the second clock signal terminal; a control electrode of the eighth transistor is connected to the first control node, a first electrode of the eighth transistor is connected to the second voltage terminal, and a second electrode of the eighth transistor is connected to the output terminal; and
a first electrode of the first capacitor is connected to the output terminal, and a second electrode of the first capacitor is connected to the third control node; a first electrode of the second capacitor is connected to the second voltage terminal, and a second electrode of the second capacitor is connected to the first control node.

Signed and Sealed this
Ninth Day of July, 2024

Katherine Kelly Vidal
*Director of the United States Patent and Trademark Office*